(12) United States Patent
Inamori et al.

(10) Patent No.: US 6,337,974 B1
(45) Date of Patent: Jan. 8, 2002

(54) CELLULAR MOBILE TELEPHONE TERMINAL

(75) Inventors: Masahiko Inamori, Takatsuki; Kaname Motoyoshi, Nishinomiya; Katsushi Tara, Kyoto, all of (JP)

(73) Assignee: Matsushita Electric Industrial Co., Ltd. (JP)

(*) Notice: Subject to any disclaimer, the term of this patent is extended or adjusted under 35 U.S.C. 154(b) by 0 days.

(21) Appl. No.: 09/578,468

(22) Filed: May 26, 2000

(30) Foreign Application Priority Data

May 31, 1999 (JP) .......................................... 11-151738

(51) Int. Cl.$^7$ ............................................. H01Q 11/12
(52) U.S. Cl. .................. 455/126; 455/69; 455/552; 327/308; 330/278
(58) Field of Search ................................ 455/422, 126, 455/522, 69, 70, 73, 575, 127, 232.1, 234.1–234.2, 239.1; 327/308, 306, 318, 324, 327–328, 560–563; 330/278

(56) References Cited

U.S. PATENT DOCUMENTS

| | | | |
|---|---|---|---|
| 4,392,245 A | * | 7/1983 | Mitama .................... 455/115 |
| 5,129,098 A | * | 7/1992 | McGirr et al. ............. 455/126 |
| 5,281,928 A | * | 1/1994 | Ravid et al. ............... 307/568 |
| 5,345,123 A | * | 9/1994 | Staudinger et al. ........ 307/552 |
| 5,689,815 A | * | 11/1997 | Yamazaki et al. ......... 455/126 |

FOREIGN PATENT DOCUMENTS

JP          8084041          3/1996

* cited by examiner

*Primary Examiner*—Doris H. To

(57) ABSTRACT

To achieve linear gain control (with a flatness of ±1 dB) over a wide range of 70 dB or greater using a single control voltage, an attenuator of the following configuration is provided in a radio frequency section of a transmitter of a cellular mobile telephone terminal. That is, a signal input-part (34) and signal output part (35) for a radio frequency signal are connected by a signal line (51) containing at least two series variable resistors (51 and 52); parallel variable resistors (53 and 54) are connected between a ground line (57) and the signal inputpart (34) and signal outputpart (35), respectively; a gain control line (56) is connected to the variable resistors (51, 52, 53, and 54); reference voltage application parts (23, 27, 31, and 33) are connected to the variable resistors (51, 52, 53, and 54), respectively; and a gain control voltage application part (19) is connected to each of the variable resistors (51, 52, 53, and 54) via the gain control line (56).

19 Claims, 18 Drawing Sheets

F I G. 3
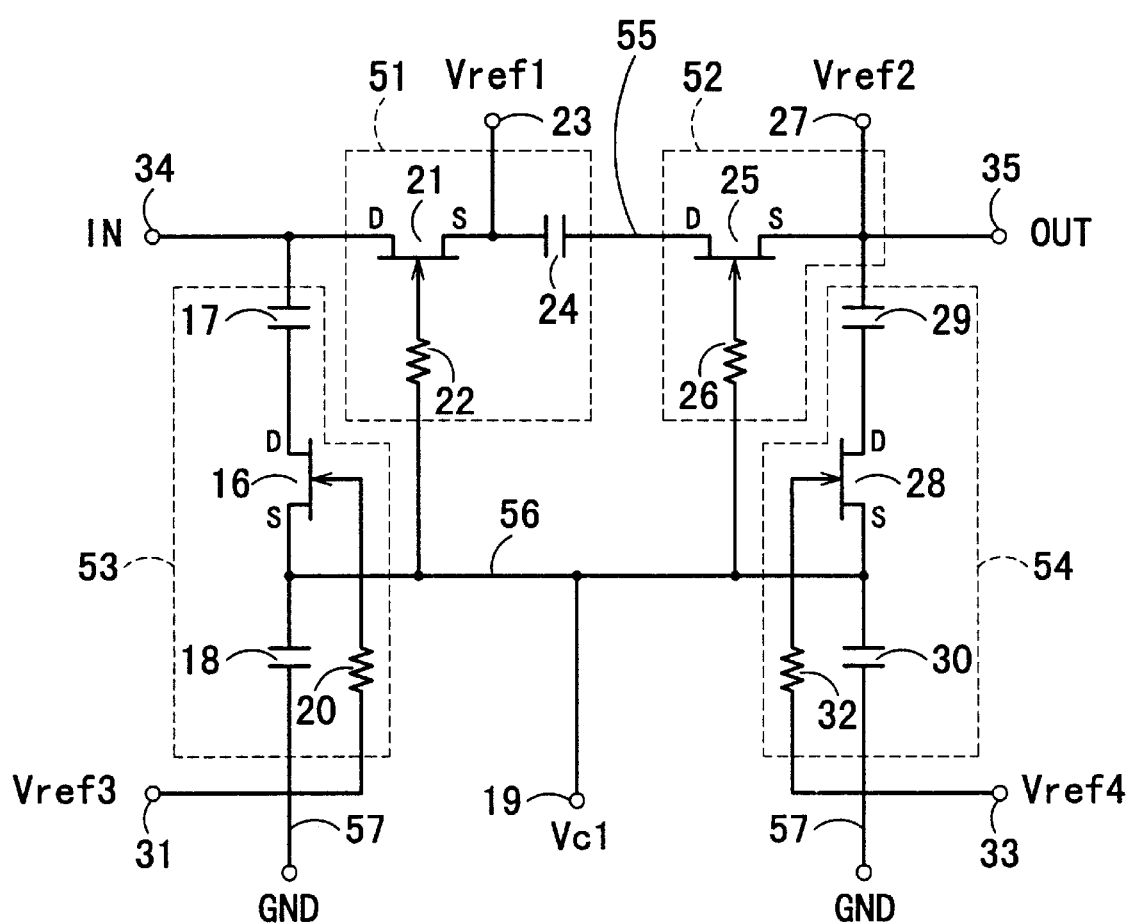

F I G. 1 2
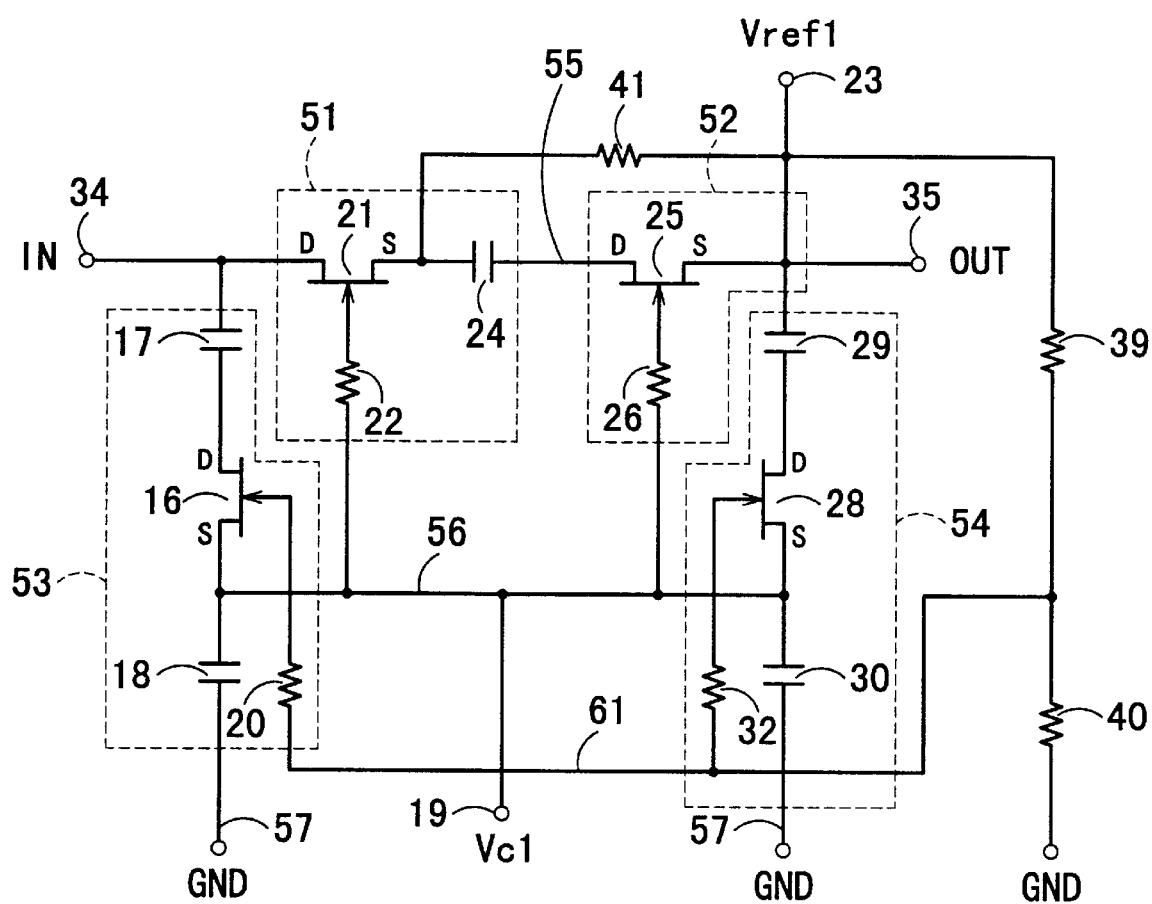

F I G. 1 4
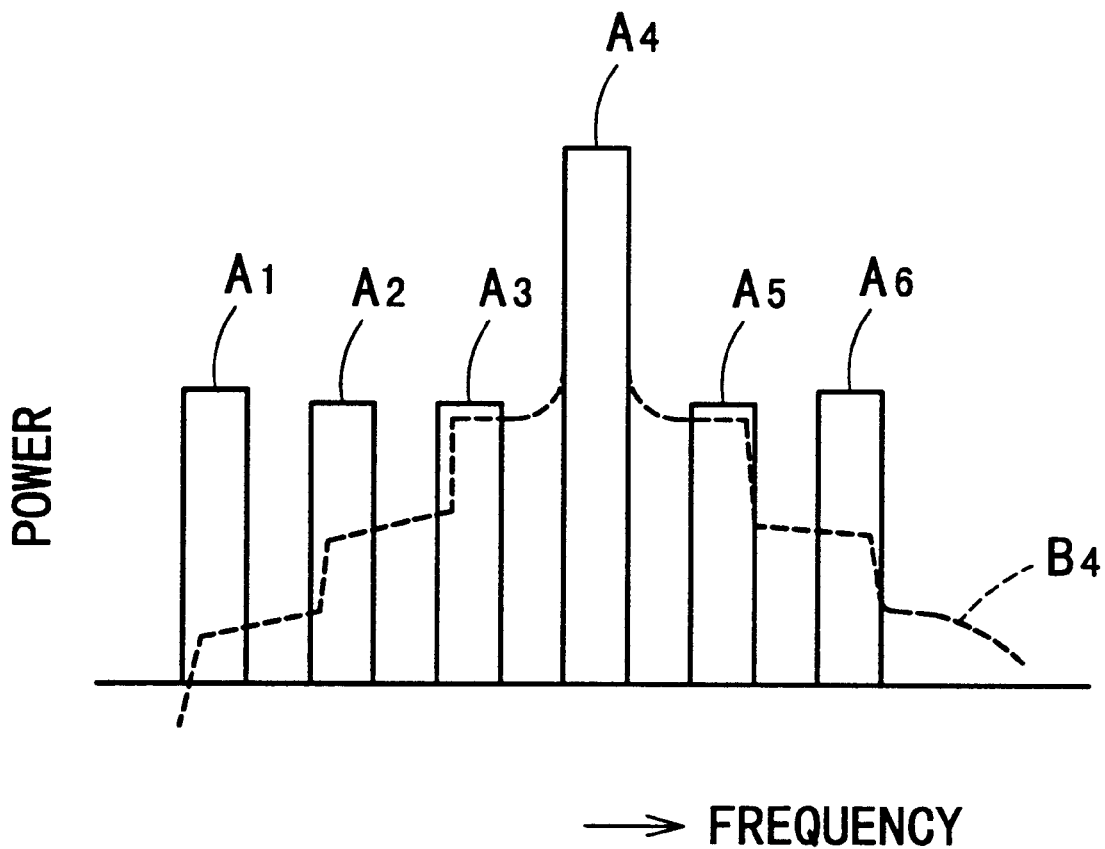

CELLULAR MOBILE TELEPHONE TERMINAL

BACKGROUND OF THE INVENTION

1. Field of the Invention

The present invention relates to a cellular mobile telephone terminal, and more particularly to the configuration of an attenuator for use in a radio frequency section in a radio transceiver section of a cellular mobile telephone terminal.

2. Description of the Related Art

In CDMA systems (for example, IS-95), signal power arriving at a base station from any cellular mobile telephone terminal must be controlled to a constant value regardless of the distance between the cellular mobile telephone terminal and the base station. To achieve this, gain control is performed in the transmitter section of each cellular mobile telephone terminal.

FIG. 13 schematically shows the relationship of the locations of cellular mobile telephone terminals relative to a base station. In FIG. 13, the cell range CL of one base station BS is several tens of kilometers in radius, for example, about 30 km in radius. Within the cell range CL of the base station BS are located many cellular mobile telephone terminals $TH_1$, $TH_2$ operating in different communication conditions, for example, at different distances from the base station BS or under different geographical or terrestrial conditions. These many cellular mobile telephone terminals $TH_1$, $TH_2$ are simultaneously performing communications with the base station BS while moving toward or away from the base station BS and under communication conditions changing from moment to moment.

In this case, if control is to be performed so that the signal power arriving at the base station BS from any cellular mobile telephone terminal will be the same whether the terminal is located farthest away from the base station or nearest to it, then considering the size of the cell range CL, the transmitter section of each cellular mobile telephone terminal is required to have a gain control width of 70 dB or greater and a high linearity of ±1 dB. This situation is known as the near-far problem.

If the gain control at the transmitter section of the cellular mobile telephone terminal is not performed properly, the signal power arriving at the base station becomes greater as the distance between the cellular mobile telephone terminal and the base station decreases; as a result, leakage power to adjacent channels increases, increasing the bit error rate and degrading the communication quality. In FIG. 14, solid lines $A_1$ to $A_6$ indicate the received signal power levels at the base station from various channels, and dashed line $B_4$ shows the intermodulation distortion characteristic of the channel $A_4$. FIG. 14 shows the case where the received signal power levels from the channels $A_3$ and $A_5$ are masked by the distortion component of the channel $A_4$ indicated by the dashed line $B_4$, so that correct data cannot be recovered from the channels $A_3$ and $A_5$ adjacent to the channel $A_4$.

To maintain a high carrier-to-noise ratio (C/N), it is desirable that the gain control in the transmitter section of each cellular mobile telephone terminal be performed, as much as possible, in the radio frequency range where the carrier signal level is high. The reason is that, at radio frequencies, the carrier signal level is far higher than the background noise level and, if the gain is lowered in the radio frequency section, a high carrier-to-noise ratio can be maintained. On the other hand, at intermediate frequencies, the carrier signal level is low and, if the gain is lowered in the intermediate frequency section, the difference between the carrier signal level and the ground noise level becomes very small, and this difference between the carrier signal level and the noise level in the intermediate frequency section is carried over directly into the radio frequency section.

However, there has not been available an attenuator, for use in a radio frequency section, that can by itself accomplish gain control with a linearity of ±1 dB over a wide range of 70 dB or greater. In the prior art, to accomplish gain control with a linearity of ±1 dB over a wide range of 70 dB or greater in the radio transmitter section of a cellular mobile telephone terminal, it has been practiced to control the gain in step-like manner in the radio frequency section while continuously controlling the gain in the intermediate frequency section. When the amount of gain control accomplished in the radio frequency section and that accomplished in the intermediate frequency section are used in combination as described above, gain control with a linearity of ±1 dB can be achieved over a wide range of 70 dB or greater.

The gain control at the cellular mobile telephone terminal is performed in the following manner.

At the cellular mobile telephone terminal, a target value for the transmit power necessary to keep the received signal strength at the base station at a constant value is set based on the received signal strength at the cellular mobile telephone terminal, and control is performed so that the transmit power matches the target value by forming a feedback control loop in which the actual transmit power is constantly compared with the target value to cause the transmit power to follow the target value.

Next, the configuration and operation of a prior art cellular mobile telephone terminal will be described with reference to FIG. 15. As shown in FIG. 15, the cellular mobile telephone terminal is constructed with microcomputer logic blocks, etc. and comprises a baseband section 100 which processes voice signals and a radio transceiver section 200 which takes as an input the voice signal processed by the baseband section 100 and performs communications with a base station.

The radio transceiver section 200 comprises a transmitter section 210 which generates signals for transmission to the base station and a receiver section 220 which receives signals transmitted from the base station.

The transmitter section 210 comprises an intermediate frequency section 230 which performs heterodyning for modulation and frequency conversion of the voice signal supplied from the baseband section 100, and a radio frequency section 240 which amplifies the radio frequency signal output from the intermediate frequency section 230 and supplies it to an antenna 300 via a duplexer 310.

The intermediate frequency section 230 comprises a modulator 231, a variable gain intermediate frequency amplifier 232 for amplifying the output signal of the modulator 231 with a variable gain, and a mixer 233 for converting the output of the variable gain intermediate frequency amplifier 232 into a radio frequency signal. The variable gain intermediate frequency amplifier 232 is usually constructed using a bipolar transistor. The variable gain intermediate frequency amplifier 232 is capable of varying its gain with a linearity of ±1 dB over a range of about 40 dB. In this case, the gain is controlled in a continuous manner over a range of about 40 dB using a continuously varying gain control voltage.

The radio frequency section 240 comprises a variable gain radio frequency amplifier 241 for amplifying the radio frequency signal output from the intermediate frequency section 230 and a power amplifier 242 for amplifying the power of the output signal of the variable gain radio frequency amplifier 241. The variable gain radio frequency amplifier 241 is capable of varying its gain with a linearity of ±3 dB over a range of about 30 dB. In this case, the gain is controlled in several steps, for example, in three steps, using a gain control voltage that takes discrete values.

The variable gain radio frequency amplifier 241 comprises a front-end amplifier (medium power amplifier) 243 and an attenuator 244 for varying the gain of the radio frequency signal to be input to the power amplifier (high power amplifier) 242 cascaded with the front-end amplifier 243. The attenuator 244 has the function of varying the amount of attenuation with a linearity of ±3 dB over a range of about 30 dB. Its gain, however, varies in step-like manner since, as described above, a discrete gain control voltage is given.

The baseband section 100 includes a control section 110. The control section 110 detects the output level of the power amplifier 242 while also detecting the signal strength of the signal received by the receiver section 220, sets an output level target value for the power amplifier 242 based on the signal strength of the received signal, compares the output level of the power amplifier 242 with the output level target value of the power amplifier 242, and applies a gain control voltage Vca responsive to the result of the comparison to the attenuator 244 and a gain control voltage Vcb responsive to the result of the comparison to the variable gain intermediate frequency amplifier 232, thereby controlling the gain of the attenuator 244 and the gain of the variable gain intermediate frequency amplifier 232 in a feedback loop so that the output level of the power amplifier 242 matches the output level target value of the power amplifier 242. In this case, as earlier described, the gain of the attenuator 244 is controlled in step-like fashion, while the gain of the variable gain intermediate frequency amplifier 232 is controlled in continuous fashion.

In the above-described cellular mobile telephone terminal, gain control with a linearity of ±1 dB over a range of 70 dB or greater is accomplished by combining the gain control of the variable gain intermediate frequency amplifier 232 with the gain control of the variable gain radio frequency amplifier 241. According to the IS-95 standard, the input stage of the mixer 233 operates in the 200 MHz band, and the output stage of the mixer 233 operates in the 837 MHz band. The signal levels at the various sections when the cellular mobile telephone terminal is operating at a maximum output are +30 dBm at the output end of the power amplifier 242 (0 dBm=1 mW), +5 dBm at the output end of the variable gain radio frequency amplifier 241, –20 dBm at the output end of the mixer 233, and –25 dBm at the output end of the variable gain intermediate frequency amplifier 232.

Assuming here that gain control over a range of 30 dB is performed in the variable gain radio frequency amplifier 241 and gain control over a range of 40 dB in the variable gain intermediate frequency amplifier 232, the signal level at the output end of the variable gain intermediate frequency amplifier 232 varies over a range of –25 dBm to –65 dBm. Further, the signal level at the output end of the mixer 233 varies over a range of –20 dBm to –60 dBm. The signal level at the output end of the variable gain radio frequency amplifier 241 varies over a range of +5 dBm to –65 dBm. The signal level at the output end of the power amplifier 242 varies over a range of +30 dBm to –40 dBm.

Next, the detailed configuration and operation of the attenuator 244 will be described with reference to FIGS. 16 to 18.

FIG. 16 is a circuit diagram showing the configuration of the attenuator 244. The step-like control of the gain is performed using the attenuator 244 as shown here. As shown in FIG. 16, the attenuator 244 comprises a field effect transistor 1 acting as a parallel variable resistor at the input side, capacitors 2, 3, 10, and 11, resistors 5, 7, and 13, a field effect transistor 6 acting as a series variable resistor, and a field effect transistor 9 acting as a parallel (shunt) variable resistor at the output side. The attenuator 244 is provided with a gain control voltage application terminal 4 at which the gain control voltage Vca is applied, a source voltage application terminal 8 at which the supply voltage VDD is applied, a gate voltage application terminal 12 at which GND potential (reference potential) is applied, an input terminal 14 as a radio frequency signal input part, and an output terminal 15 as a radio frequency signal output part. The input terminal 14 is connected to the output end of the mixer 233 in FIG. 15, while the output terminal 15 is connected to the input end of the front-end amplifier 243. Here, the capacitors 2, 3, 10, and 11 act to block the application of DC voltages, and the resistors 5, 7, and 13 each act to prevent the infiltration of radio frequency signals.

FIG. 17 is a diagram showing the gain control characteristics of the attenuator.

The operation of the attenuator having the above-described configuration will be explained. The cellular mobile telephone terminal here operates with a maximum voltage of about 3.0 V supplied from a lithium battery or the like. The threshold voltage of each field effect transistor refers to the bias required to cause the variable resistor to start its gain control operation. The field effect transistors 6, 1, and 9 forming the series variable resistor and the parallel variable resistors, respectively, are chosen to have the same threshold voltage. Designated voltages are applied at the source voltage application terminal 8 of the field effect transistor 6 and the gate voltage application terminal 12 of the field effect transistors 1 and 9.

When a voltage of 0 to 1.1 V is applied as the gain control voltage Vca to the gain control voltage application terminal 4 (the gain control voltage range (a) in FIG. 17), the resistance value $R_{ON}$ (T-FET) of the field effect transistor 6 is at its maximum level, while the resistance value $R_{ON}$ (S-FET) of the field effect transistors 1 and 9 is held at its minimum level; as a result, the signal input via the input terminal 14 is attenuated with no increase in gain, and the output signal $P_{OUT}$ from the output terminal 15 is at its minimum level.

When the voltage applied at the gain control voltage application terminal 4 is increased above 1.1 V (the gain control voltage range (b) in FIG. 17), the resistance value $R_{ON}$ (T-FET) of the field effect transistor 6 begins to decrease, while the resistance value $R_{ON}$ (S-FET) of the field effect transistors 1 and 9 remains held at its minimum level; as a result, the output signal $P_{OUT}$ increases. Usually, the gain control voltage operating range of a variable resistor implemented by a field effect transistor is about 0.2 to 0.3 V wide; therefore, the gain increases linearly by 18 dB until the voltage applied at the gain control voltage application terminal 4 reaches 1.4 V.

When the voltage applied at the gain control voltage application terminal 4 reaches 1.4 V (the gain control voltage range (c) in FIG. 17), the resistance value $R_{ON}$ (T-FET) of the field effect transistor 6, which has been decreasing, now reaches its minimum level, while the resistance value $R_{ON}$ (S-FET) of the field effect transistors 1 and 9 held at its minimum level begins to increase, so that the output signal $P_{OUT}$ further increases. Here, the gain increases linearly by 12 dB, this time with a sensitivity different from that in the gain control voltage range (b) of 1.1 to 1.4 V, until the voltage applied at the gain control voltage application terminal 4 reaches 1.7 V.

When the voltage applied at the gain control voltage application terminal 4 reaches 1.7 V (the gain control voltage range (d) in FIG. 17), the resistance value $R_{ON}$ (S-FET) of the field effect transistors 1 and 9 is now at its maximum level, while the resistance value $R_{ON}$ (T-FET) of the field effect transistor 6 remains held at its minimum level; as a result, the output signal $P_{OUT}$ reaches maximum. At this point, the gain control width of this amplifier is 30 dB. If a voltage greater than 1.7 V is applied to the gain control voltage application terminal 4, the resistance value $R_{ON}$ (T-FET) of the field effect transistor 6 remains at its minimum level while the resistance value $R_{ON}$ (S-FET) of the field effect transistors 1 and 9 remains at its maximum level, so that the output signal $P_{OUT}$ remains unchanged at its maximum level.

In the attenuator having the above-described gain control characteristics, the output level is changed in three steps by selectively applying, for example, three values $V_{CL}$, $V_{CM}$, and $V_{CH}$ as the gain control voltage Vca, as shown in FIG. 18.

On the other hand, in the variable gain intermediate frequency amplifier 232, the output level is varied continuously by varying the gain control voltage Vcb, as shown in FIG. 19.

However, if gain control over a range wider than 70 dB is performed by combining the step control in the radio frequency section with the continuous control in the intermediate frequency section, as described above, since the gain control voltage for the continuous control and the control voltage for the step control are simultaneously changed when the control mode is switched from one mode to the next in the step control, gain differences may occur before and after the mode switching because of variations in the characteristics of the attenuator 244 and variable gain intermediate frequency amplifier 232. Here, consider a situation where the cellular mobile telephone terminal is performing communications under ideal conditions while moving away from the base station at a constant speed; in this situation, if the above condition occurs, the output $P_{OUT}$ of the cellular mobile telephone terminal, which should normally increase linearly by virtue of its gain control function, momentarily deviates from the linear control line at the instant of mode switching in the step control, as shown in FIG. 20, because of a delay in tracking operation due to a time delay of the feedback control and because of the output level discontinuity at the time of mode switching. If this happens, the received signal strength at the base station deviates from the specified value, causing level differences with respect to the adjacent channels and thus disrupting voice signals and degrading voice communication quality. Though the problem here is described dealing with the case where the cellular mobile telephone terminal is moving under ideal conditions, it will be noted that the actual condition when the cellular mobile telephone terminal is moving around is usually much worse, for example, the cellular mobile telephone terminal might move behind a building, causing an abrupt drop in the received signal strength; in actual situations, therefore, the problem of the received signal strength at the base station deviating from the specified value is expected to occur frequently, resulting in further degradation of the voice communication quality.

Furthermore, since the two kinds of gain control voltages Vca and Vcb for controlling the variable gain radio frequency amplifier 241 and the variable gain intermediate frequency amplifier 231 have to be set in the control section 110 of the baseband section 100, control logic of the control section 110 becomes complex.

Moreover, the variable gain intermediate frequency amplifier 231 has to be provided in the intermediate frequency section 230 in addition to the variable gain radio frequency amplifier 241 provided in the radio frequency section 240; this has led to the problem that the circuit configuration increases not only in complexity but also in size, increasing the overall size of the cellular mobile telephone terminal.

SUMMARY OF THE INVENTION

It is, accordingly, an object of the present invention to provide a cellular mobile telephone terminal capable of achieving high quality voice communications.

It is another object of the present invention to provide a cellular mobile telephone terminal that can simplify the gain control.

It is a further object of the present invention to provide a cellular mobile telephone terminal that can achieve a space saving and compact construction.

A cellular mobile telephone terminal according to the present invention comprises a baseband section for processing a voice signal and a radio transceiver section for taking as an input the voice signal processed by the baseband section and for performing communications with a base station. The radio transceiver section comprises a transmitter section for generating a signal for transmission to the base station and a receiver section for receiving a signal transmitted from the base station. The transmitter section comprises an intermediate frequency section for performing heterodyning for modulation and frequency conversion of the voice signal supplied from the baseband section and a radio frequency section for amplifying a radio frequency signal output from the intermediate frequency section and for supplying the amplified signal to an antenna. The radio frequency section comprises a gain controller for controlling the gain of the radio frequency signal output from the intermediate frequency section and a power amplifier for amplifying the power of an output of the gain controller.

The baseband section includes a control section, and the control section detects the output level of the power amplifier while also detecting signal strength of the signal received by the receiver section, sets an output level target value for the power amplifier based on the signal strength of the received signal, compares the output level of the power amplifier with the output level target value of the power amplifier, and applies to the gain controller a gain control voltage responsive to the result of the comparison, thereby controlling the gain of the gain controller in a feedback loop so that the output level of the power amplifier matches the output level target value of the power amplifier.

The gain controller comprises: at least two series variable resistors formed, for example, field effect transistors, inserted in a signal line connecting between a signal input part and signal output part for the radio frequency signal; and parallel variable resistors formed, for example, from field effect transistors, connected between a ground line and the signal input part and signal output part, respectively, and the gain controller controls the output of the power amplifier linearly and in substantially continuous fashion by controlling the gain of each variable resistor through the gain control voltage which is applied to a gain control voltage application part.

According to the above configuration, the gain controller acting an attenuator is constructed using at least two series variable resistors formed from field effect transistors connected in multiple stages in conjunction with parallel variable resistors, and the gain controller controls the output of the power amplifier linearly and in substantially continuous fashion by controlling the gain of each variable resistor; this eliminates the problem associated with the step-like gain switching, and ensures high quality voice communications. Further, since the gain control need only be performed in the radio frequency section, the gain control can be simplified. Furthermore, since the variable gain intermediate frequency amplifier in the intermediate frequency section can be omitted, space saving and compact construction can be realized.

A cellular mobile telephone terminal according to the present invention comprises a baseband section for processing a voice signal and a radio transceiver section for taking as an input the voice signal processed by the baseband section and for performing communications with a base station. The radio transceiver section comprises a transmitter section for generating a signal for transmission to the base station and a receiver section for receiving a signal transmitted from the base station. The transmitter section comprises an intermediate frequency section for performing heterodyning for modulation and frequency conversion of the voice signal supplied from the baseband section and a radio frequency section for amplifying a radio frequency signal output from the intermediate frequency section and for supplying the amplified signal to an antenna. The radio frequency section comprises a gain controller for controlling the gain of the radio frequency signal output from the intermediate frequency section and a power amplifier for amplifying the power of an output of the gain controller.

The baseband section includes a control section, and the control section detects the output level of the power amplifier while also detecting signal strength of the signal received by the receiver section, sets an output level target value for the power amplifier based on the signal strength of the received signal, compares the output level of the power amplifier with the output level target value of the power amplifier, and applies to the gain controller a gain control voltage responsive to the result of the comparison, thereby controlling the gain of the gain controller in a feedback loop so that the output level of the power amplifier matches the output level target value of the power amplifier.

The gain controller comprises: at least two series variable resistors formed, for example, field effect transistors, inserted in a signal line connecting between a signal input part and signal output part for the radio frequency signal; and parallel variable resistors formed, for example, from field effect transistors, connected between a ground line and the signal input part and signal output part, respectively.

According to the above configuration, the gain controller acting an attenuator is constructed using at least two series variable resistors formed from field effect transistors connected in multiple stages in conjunction with parallel variable resistors, and the operation points of the at least two series variable resistors, formed from field effect transistors connected in multiple stages, are displaced from each other by an amount corresponding to the width of a linear gain control operation range and the linear operation ranges of the respective series variable resistors are concatenated, the combined linear operation range of the series variable resistors then being made substantially continuous with the linear operation range of the parallel variable resistors. In this arrangement, since switching between each mode is made using a single gain control voltage, gain differences do not occur and a highly accurate linear gain control operation can be performed over a wide range of 70 dB or greater.

As a result, the cellular mobile telephone terminal using the gain control described above solves the problem associated with the step-like gain switching and achieves high quality voice communications. Further, since the gain control need only be performed in the radio frequency section, the gain control can be simplified. Furthermore, since the variable gain intermediate frequency amplifier in the intermediate frequency section can be omitted, space saving and compact construction can be realized.

In one configuration where the operation points of the at least two series variable resistors, formed from field effect transistors connected in multiple stages, are displaced from each other by an amount corresponding to the width of the linear gain control operation range, different reference voltages are applied to the sources of the at least two field effect transistors connected in series. With this configuration, extremely accurate gain control can be achieved, as the gain control is performed using a single gain control voltage. The setting of the gain control operation voltage can be changed as desired.

In another configuration, different gain control voltages are applied to the gates of the at least two field effect transistors connected in series. With this configuration, since the same reference voltage is applied to the sources of the at least two field effect transistors acting as the series variable resistors, accurate and linear gain control can be achieved despite fluctuations in the reference voltage. The setting of the gain control operation voltage can be changed as desired. In the above-described configuration, different gain control voltages are applied to the gates of the two or more field effect transistors, but they can in effect be regarded as one control voltage since the voltage value is simply shifted.

In still another configuration, field effect transistors having different threshold voltages are employed for the at least two field effect transistors connected in series. With this configuration, extremely accurate gain control can be achieved, as the gain control is performed using a single gain control voltage. Furthermore, since the same reference voltage is applied to the sources of the at least two field effect transistors acting as the series variable resistors, accurate and linear gain control can be achieved despite fluctuations in the reference voltage. Moreover, this configuration serves to simplify the circuit configuration, because the number of voltages to be applied can be reduced.

BRIEF DESCRIPTION OF THE DRAWINGS

FIG. 3 is a circuit diagram showing the detailed configuration of the attenuator of FIG. 2;

FIG. 12 is a circuit diagram showing the detailed configuration of the attenuator in FIG. 10 when bias resistors 41, 39, and 40 are provided so that reference voltages can be applied to respective variable resistors;

FIG. 14 is an explanatory diagram showing received signal strengths from various channels;

DESCRIPTION OF THE PREFERRED EMBODIMENTS

A first embodiment of the present invention will be described with reference to FIGS. 1 to 6.

Figure 1:
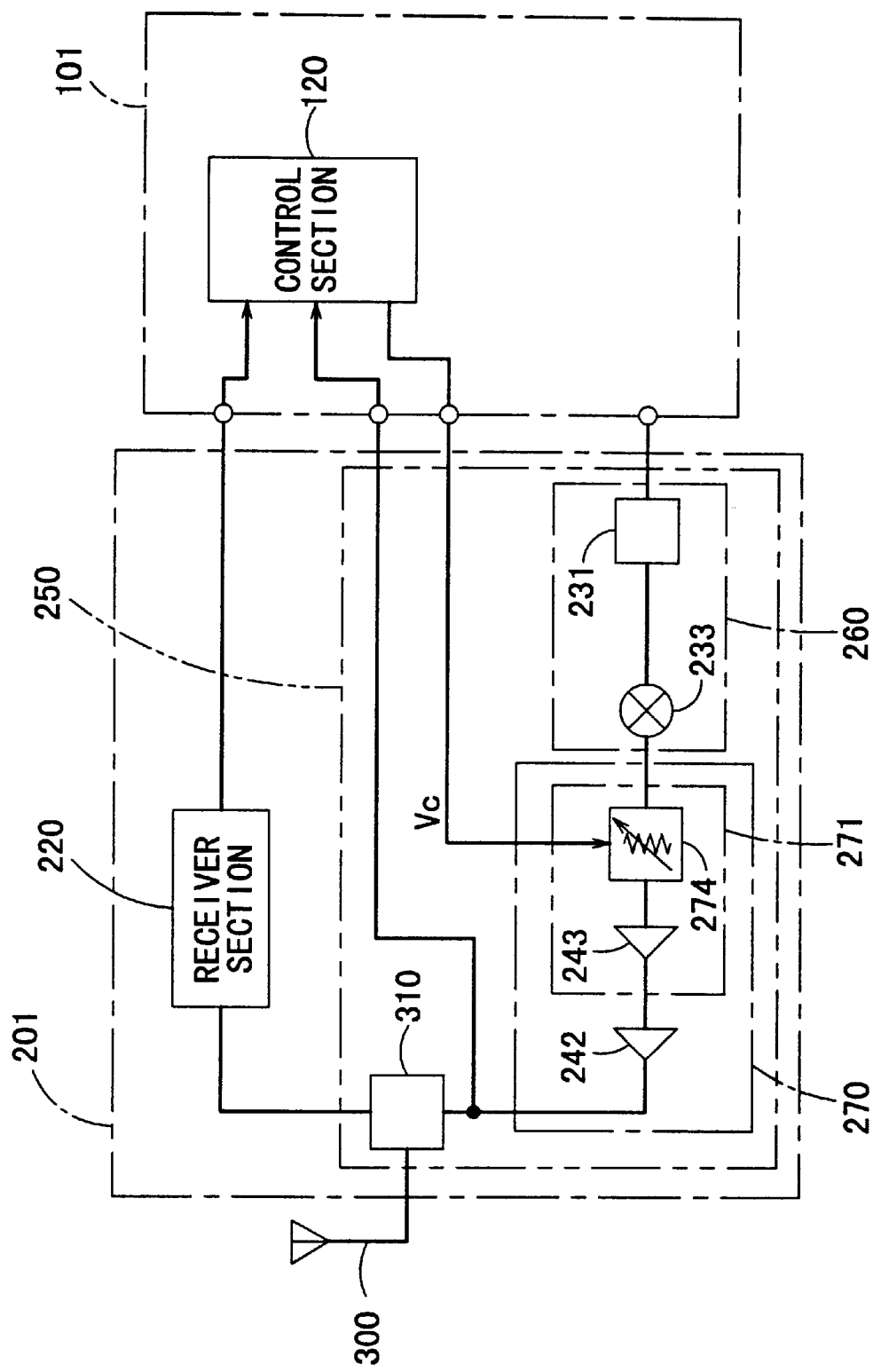
FIG. 1 is a block diagram showing the configuration of a cellular mobile telephone terminal according to a first embodiment of the present invention.

FIG. 1 shows a block diagram of a cellular mobile telephone terminal according to the first embodiment of the present invention. The configuration and operation of the cellular mobile telephone terminal according to the first embodiment will be described with reference to FIG. 1.

As shown in FIG. 1, the cellular mobile telephone terminal is constructed with microcomputer logic blocks, etc. and comprises a baseband section 101 which processes voice signals and a radio transceiver section 201 which takes as an input the voice signal processed by the baseband section 101 and performs communications with a base station.

The radio transceiver section 201 comprises a transmitter section 250 which generates signals for transmission to the base station and a receiver section 220 which receives signals transmitted from the base station.

The transmitter section 250 comprises an intermediate frequency section 260 which performs heterodyning for modulation and frequency conversion of the voice signal supplied from the baseband section 101, and a radio frequency section 270 which amplifies the radio frequency signal output from the intermediate frequency section 260 and supplies it to an antenna 300 via a duplexer 310.

The intermediate frequency section 260 comprises a modulator 231 and a mixer 233 for converting the output signal of the modulator 231 into a radio frequency signal. The variable gain intermediate frequency amplifier is not provided here.

The radio frequency section 270 comprises a gain controller 271 for controlling the gain of the radio frequency signal output from the intermediate frequency section 260 and a power amplifier 242 for amplifying the power of the output signal of the gain controller 271. The gain controller 271 is capable of varying the gain with a linearity of ±1 dB over a range of 70 dB or greater. In this case, the gain is controlled in continuous fashion over a range of 70 dB or greater using a continuously varying gain control voltage.

The gain controller 271 comprises a front-end amplifier (medium power amplifier) 243 and an attenuator 274 for varying the gain of the radio frequency signal to be input to the power amplifier (high power amplifier) 242 cascaded with the front-end amplifier 243. The attenuator 274 has the function of varying the amount of attenuation with a linearity of ±1 dB over a range of 70 dB or greater in order to vary the gain with a linearity of ±1 dB over a range of 70 dB or greater. In this embodiment, power amplification is performed using two-stage amplifiers consisting of the front-end amplifier 243 and power amplifier 242, but power amplification may be performed using a single-stage amplifier.

The baseband section 101 includes a control section 120 constructed with microcomputer logic, etc. The control section 120 detects the output level of the power amplifier 242 while also detecting the signal strength of the signal received by the receiver section 220, sets an output level target value for the power amplifier 242 based on the signal strength of the received signal, compares the output level of the power amplifier 242 with the output level target value of the power amplifier 242, and applies to the attenuator 274 a gain control voltage Vc responsive to the result of the comparison, thereby controlling the gain of the attenuator 274 in a feed back loop so that the output level of the power amplifier 242 matches the output level target value of the power amplifier 242. In this case, as earlier described, the gain of the attenuator 274 is controlled in continuous fashion over a range of 70 dB or greater.

In the above-described cellular mobile telephone terminal, gain control with a linearity of ±1 dB over a range of 70 dB or greater is accomplished by the gain control of the gain controller 271 alone, as described above. According to the IS-95 standard, the input stage of the mixer 233 operates in the 200 MHz band, and the output stage of the mixer 233 operates in the 837 MHz band. The signal levels at the various sections when the cellular mobile telephone terminal is operating at a maximum output are +30 dBm at the output end of the power amplifier 242 (0 dBm =1 mW), +5 dBm at the output end of the gain controller 271, −20 dBm at the output end of the mixer 233, and −25 dBm at the output end of the modulator 231.

Assuming here that gain control over a range of 70 dB is performed by the gain controller 271, the signal level at the output end of the modulator 231 is constant at −25 dBm. Further, the signal level at the output end of the mixer 233 is constant at −20 dBm. The signal level at the output end of the gain controller 271 varies over a range of +5 dBm to −65 dBm. The signal level at the output end of the power amplifier 242 varies over a range of +30 dBm to −40 dBm.

Next, the detailed configuration and operation of the attenuator 274 will be described with reference to FIGS. 2 to 6.

Figure 2:
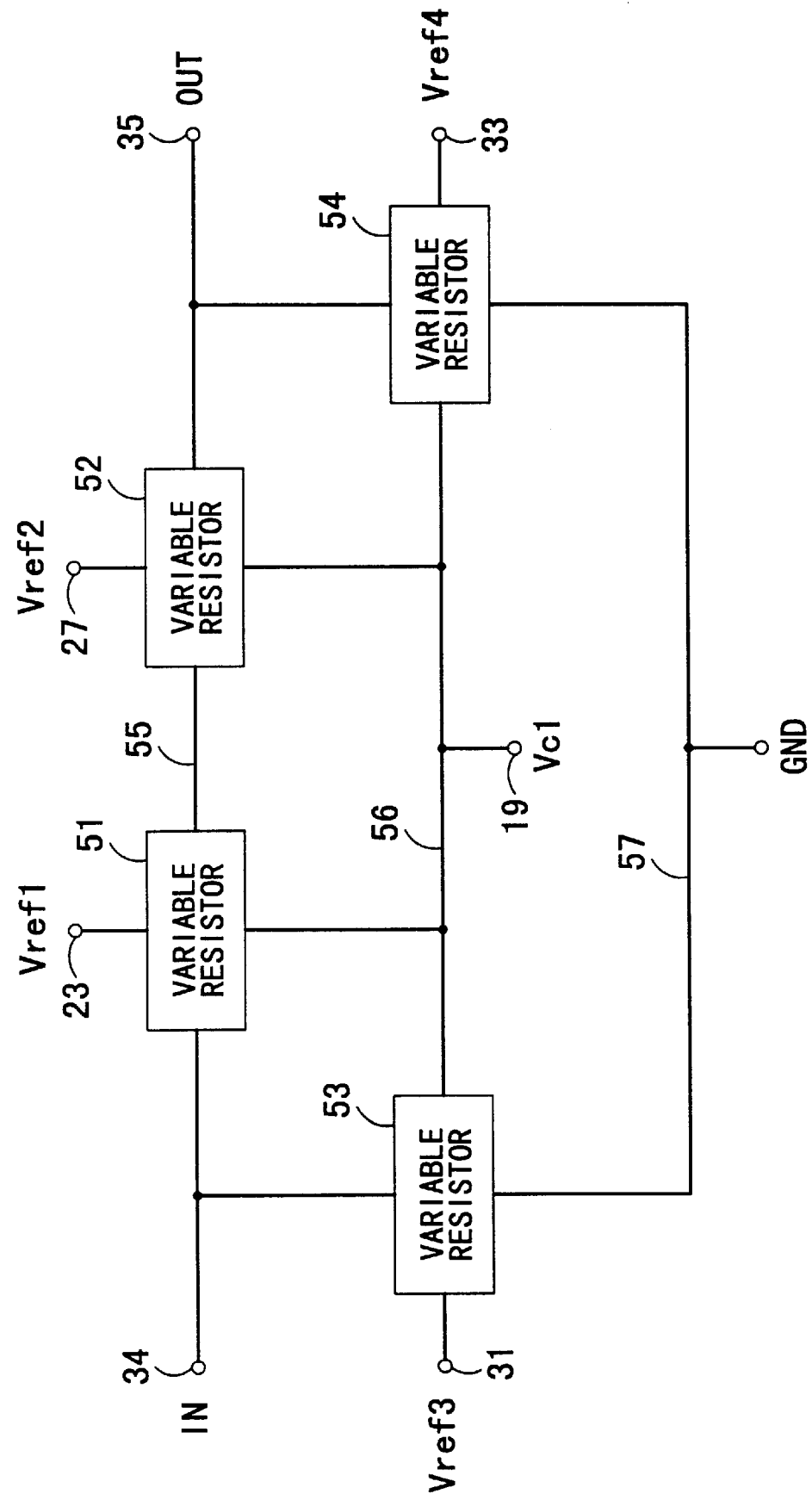
FIG. 2 is a block diagram showing the configuration of an attenuator in the cellular mobile telephone terminal of FIG. 1.

FIG. 2 is a simplified block diagram showing the configuration of the attenuator (semiconductor integrated circuit device) 274, and FIG. 3 is a circuit diagram showing the detailed configuration of the attenuator 274. The attenuator 274 is integrated on a single semiconductor (GaAs) substrate. The illustrated circuit can also be integrated on a silicon substrate; in that case, microcomputer logic blocks can be integrated on the same substrate.

By using the attenuator of the illustrated configuration and performing continuous control of the gain using a region where the gain varies linearly, gain control having excellent linearity over a wide range can be accomplished, compared with the configuration that uses a single series variable resistor. As a result, gain control having excellent linearity over a wide range can be achieved using the attenuator without combining it with the control performed by an intermediate frequency amplifier. It is also possible to achieve gain control having excellent linearity over a wider range by increasing the number of series variable resistors.

As shown in FIGS. 2 and 3, the attenuator includes a signal line 55 containing at least two series variable resistors 51 and 52 and connecting between an input terminal 34 as a signal input part and an output terminal 35 as a signal output part, and parallel (shunt) variable resistors 53 and 54 are connected between a ground line 57 and the input terminal 34 and output terminal 35, respectively. The ground line 57 is connected to ground GND which is a base potential part. A gain control line 56 is connected to the variable resistors 51, 52, 53, and 54. In the illustrated attenuator, reference voltage application terminals 23, 27, 31, and 33 as reference voltage application parts are connected to the variable resistors 51, 52, 53, and 54, respectively, and reference voltages Vref1, Vref2, Vref3 and Vref4 are applied to the respective reference voltage application terminals 23, 27, 31, and 33. Further, a gain control voltage application terminal 19 as a gain control voltage application part is connected to each of the variable resistors 51, 52, 53, and 54 via the gain control line 56. Here, the circuit may be configured so that a common reference voltage is applied to the parallel variable resistors 53 and 54. This also applies to other embodiments described herein.

The variable resistors 51, 52, 53, and 54 are constructed using at least field effect transistors 21, 25, 16, and 28 and resistors 22, 26, 20, and 32 connected to the gates of the respective field effect transistors. The drain of the field effect transistor 21 forming the series variable resistor 51 at the input side is connected to the input terminal 34, and its source is connected to one end of a capacitor 24. The drain of the field effect transistor 25 forming the series variable resistor 52 at the output side is connected to the other end of the capacitor 24, and its source is connected to the output terminal 35. On the other hand, the drain of the field effect transistor 16 forming the parallel variable resistor 53 at the input side is connected to the input terminal 34 via a capacitor 17, and its source is connected to the ground GND via a capacitor 18 and via the ground line 57. Likewise, the drain of the field effect transistor 28 forming the parallel variable resistor 54 at the output side is connected to the output terminal 35 via a capacitor 29, and its source is connected to the ground GND via a capacitor 30 and via the ground line 57.

Further, the gate of the field effect transistor 21 forming the variable resistor 51 is connected to the gain control voltage application terminal 19 via the resistor 22 and gain control line 56; the gate of the field effect transistor 25 forming the variable resistor 52 is connected to the gain control voltage application terminal 19 via the resistor 26 and gain control line 56; the source of the field effect transistor 16 forming the variable resistor 53 is connected to the gain control voltage application terminal 19 via the gain control line 56; and the source of the field effect transistor 28 forming the variable resistor 54 is connected to the gain control voltage application terminal 19 via the gain control line 56.

The reference voltages Vref1 and Vref2 from the reference voltage application terminals 23 and 27 are applied to the sources of the field effect transistors 21 and 25 forming the variable resistors 51 and 52, respectively, while the reference voltages Vref3 and Vref4 from the reference voltage application terminals 31 and 33 are applied, via the respective resistors 20 and 32, to the gates of the field effect transistors 16 and 28 forming the variable resistors 53 and 54, respectively.

Here, the capacitors 17, 18, 24, 29, and 30 act to prevent the application of DC voltages, while the resistors 20, 22, 26, and 32 each act to block the infiltration of radio frequency signals.

To block the infiltration of radio frequency signals, an upper limit value and a lower limit value are set for each of the resistors 20, 22, 26, and 32, for example, as described below. The lower limit value is 1 kΩ. The reason for this setting is that unless an isolation of 20 dB or greater is provided, radio frequency signals may be allowed to infiltrate, increasing losses, etc. and thus affecting the control characteristic; when the lower limit is set to the above value, an isolation of 20 dB or greater can be obtained.

The upper limit value is 100 kΩ. The reason for this setting is that when a gate leakage current of 1 μA, for example, flows in the field effect transistor, if the resistance value of the resistor connected to the gate of the field effect transistor is 100 kΩ, the voltage drop $V_{DROP}$ across the resistor is given by $$V_{DROP} = 1 \times 10^{-6} \times 100 \times 10^{3} = 0.1 \quad (V)$$

which means that if the resistance value exceeds 100 kΩ, displacement in the control voltage exceeds 0.1 V, which can cause a substantial influence on the control characteristic.

The operation of the attenuator having the above-described configuration will be explained below. The portable terminal operates with a maximum voltage of about 3.0 V supplied from a lithium battery or the like. The threshold voltage of each field effect transistor refers to the bias required to cause the variable resistor to start its gain control operation; here, the field effect transistors forming the series variable resistors 51 and 52 and parallel variable resistors 53 and 54 are chosen to have the same threshold voltage. In this embodiment, the threshold voltage is chosen to be −0.7 V.

The reference voltages Vref1 and Vref2 of different values are applied to the reference voltage application terminals 23 and 27 of the series variable resistors 51 and 52, while the reference voltages Vref3 and Vref4 of the same value are applied to the reference voltage application terminals 31 and 33 of the parallel variable resistors 53 and 54. The reference voltages Vref1 and Vref2 applied to the reference voltage application terminals 23 and 27 of the series variable resistors 51 and 52 are so set that the reference voltage Vref1 applied to the reference voltage application terminal 23 at the input side is higher than the reference voltage Vref2 applied to the reference voltage application terminal 27 at the output side by a value corresponding to the width of a linear gain control operating voltage range (0.2 to 0.3 V).

The reference voltages Vref1, Vref2, Vref3, and Vref4 should be set so that the linear gain control operation ranges of the series variable resistors 51 and 52 and parallel variable resistors 53 and 54 can be regarded as being substantially continuous with each other. This also applies to other embodiments described herein.

Here, each variable resistor formed from a field effect transistor is completely off and exhibits the greatest resistance value when its gate to source voltage VGS drops below the threshold voltage Vth of the field effect transistor (VGS≦Vth). The gate to source voltage VGS of each field effect transistor is expressed by the difference between the gate voltage VG and source voltage VS (VG–VS), and the resistance value varies in accordance with the combination of the gain control voltage Vc1 and the reference voltage Vref1, Vref2, Vref3, or Vref4, respectively. Accordingly, by varying the set values of the reference voltages Vref1, Vref2, Vref3, and Vref4, it becomes possible to control the range of the gain control voltage Vc1 over which the gain can be controlled by the respective variable resistors.

The gain control range relative to the gain control voltage Vc1 is split between the series variable resistors 51 and 52 and the parallel variable resistors 53 and 54 such that the series variable resistor 52 is responsible for the gain control in the low voltage range, the series variable resistor 51 is responsible for the gain control in the middle voltage range, and the parallel variable resistors 53 and 54 are responsible for the gain control in the high voltage range, but the order may be reversed and can be set as appropriate. For example, the series variable resistor 52 may be set to perform the gain control in the middle voltage range, the series variable resistor 51 to perform the gain control in the low voltage range, and the parallel variable resistors 53 and 54 to perform the gain control in the high voltage range. Alternatively, the parallel variable resistors 53 and 54 may be set to perform the gain control in the low voltage range, the series variable resistor 52 to perform the gain control in the middle voltage range, and the series variable resistor 51 to perform the gain control in the high voltage range. Furthermore, the parallel variable resistors 53 and 54 may be set to perform the gain control in the low voltage range, the series variable resistor 51 to perform the gain control in the middle voltage range, and the series variable resistor 52 to perform the gain control in the high voltage range.

As described above, in performing the continuous gain control, the reference voltage Vref1 for the series variable resistor 51, the reference voltage Vref2 for the series variable resistor 52, and the reference voltages Vref3 and Vref4 for the parallel variable resistors 53 and 54 are set appropriately so that the gain control operation ranges of the series variable resistors 51 and 52 and parallel variable resistors 53 and 54 are concatenated in smoothly continuing fashion; in this way, gain control having excellent linearity can be performed over a wide range of 70 dB or greater using a single gain control voltage.

Figure 4:
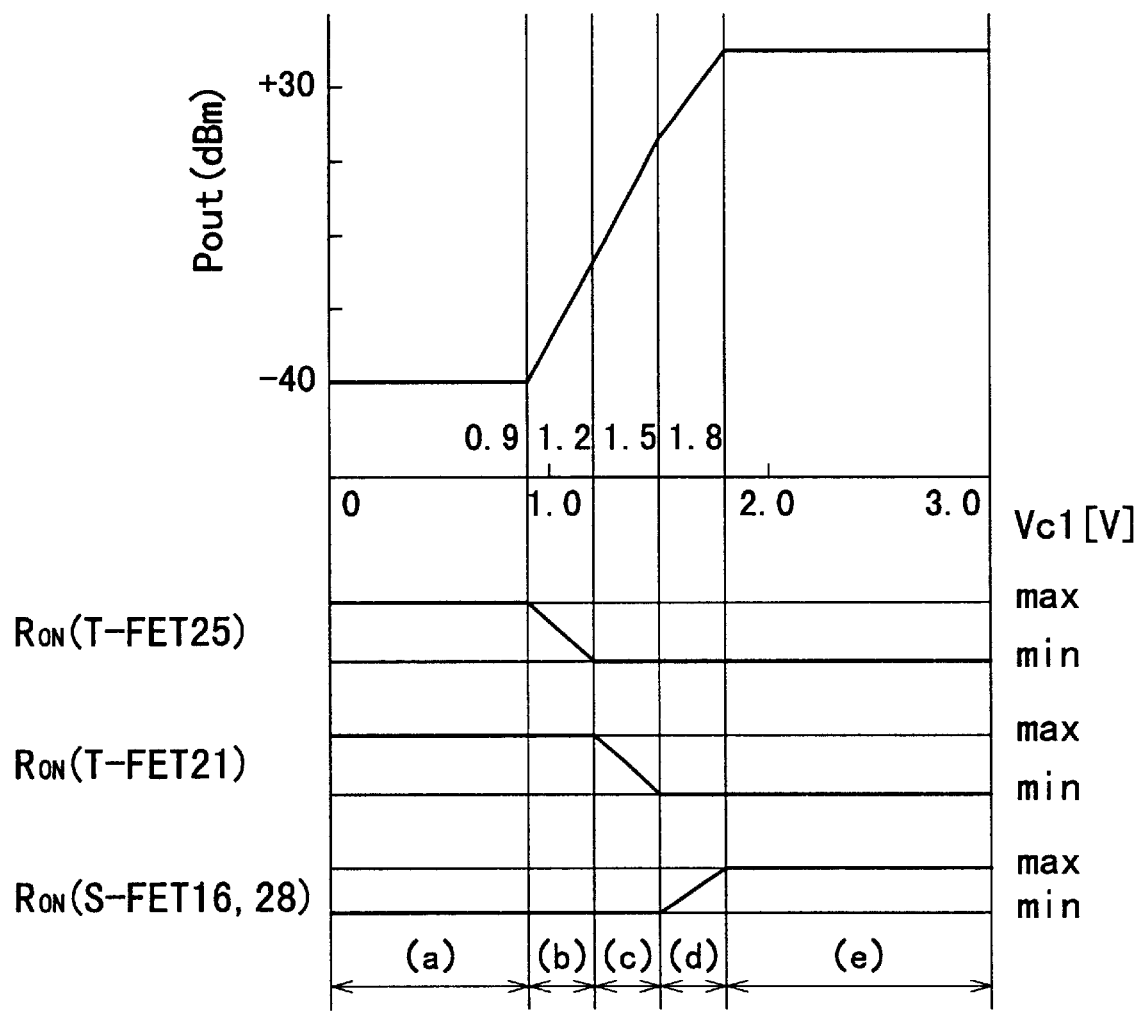
FIG. 4 is a diagram showing the gain control voltage versus gain control characteristic of the attenuator of FIG. 2.

FIG. 4 is a diagram showing the gain control voltage Vc1 versus gain control characteristic of the attenuator shown in FIG. 3. The operation of the attenuator of FIG. 3 will be described below with reference to FIG. 4.

Assuming that the threshold voltage Vth of all the field transistors is –0.7 V, the reference voltage Vref1 is set to 1.9 V, the reference voltage Vref2 is set to 1.6 V, and the reference voltages Vref3 and Vref4 are both set to 1.1 V.

When a voltage of 0 to 0.9 V is applied to the gain control voltage application terminal 19 (the gain control voltage range (a) in FIG. 4), the resistance values $R_{ON}$ (T-FET21) and RON (T-FET25) of the series variable resistors 51 and 52 are at their maximum levels, while the resistance value $R_{ON}$ (S-FET16, 28) of each of the parallel variable resistors 53 and 54 is held at its minimum level; as a result, the signal input from the input terminal 34 is attenuated, with no increase in gain, and the magnitude of the output signal $P_{OUT}$ at the output terminal 35 is at its minimum level.

When a voltage greater than 0.9 V is applied to the gain control voltage application terminal 19 (the gain control voltage range (b) in FIG. 4), the resistance value $R_{ON}$ (TFET25) of the series variable resistor 52 at the output side begins to decrease, while the resistance value $R_{ON}$ (S-FET16, 28) of each of the parallel variable resistors 53 and 54 remains held at the minimum level and the resistance value $R_{ON}$ (T-FET21) of the series variable resistor 51 at the input side remains held at the maximum level; as a result, the magnitude of the output signal $P_{OUT}$ increases. Usually, the gain control voltage operation range where a variable resistor formed from a field effect transistor performs a linear gain control operation is about 0.2 to 0.3 V wide; therefore, the gain increases linearly by 24 dB until the voltage applied to the gain control voltage application terminal 19 reaches 1.2 V.

When the voltage applied to the gain control voltage application terminal 19 reaches 1.2 V (the gain control voltage range (c) in FIG. 4), the resistance value $R_{ON}$ (T-FET25) of the series variable resistor 52 at the output side, which has been decreasing, now reaches the minimum level, while the resistance value $R_{ON}$ (T-FET21) of the series variable resistor 51 at the input side, which has been held at maximum, begins to decrease, so that the magnitude of the output signal $P_{OUT}$ continues to increase with the same sensitivity. The gain increases linearly by 24 dB until the voltage applied to the gain control voltage application terminal 19 reaches 1.5 V. In the meantime, the resistance value $R_{ON}$ (S-FET16, 28) of each of the parallel variable resistors 53 and 54 remains held at the minimum level.

When the voltage applied to the gain control voltage application terminal 19 reaches 1.5 V (the gain control voltage range (d) in FIG. 4), the resistance value $R_{ON}$ (T-FET21) of the series variable resistor 51 at the input side, which has been decreasing, now reaches the minimum level, the same level at which the resistance value $R_{ON}$ (T-FET25) of the series variable resistor 52 at the output side has been held, while on the other hand, the resistance value $R_{ON}$ (S-FET16, 28) of each of the parallel variable resistors 53 and 54, which has been held at the minimum level, beings to increase, so that the magnitude of the output signal $P_{OUT}$ increases linearly by 23 dB, this time with a sensitivity different from that in the voltage range of 0.9 to 1.5 V.

When the voltage applied to the gain control voltage application terminal 19 reaches 1.8 V (the gain control voltage range (e) in FIG. 4), the resistance value $R_{ON}$ (S-FET16, 28) of each of the parallel variable resistors 53 and 54 is now at the maximum level, while the resistance values $R_{ON}$ (T-FET21) and $R_{ON}$ (T-FET25) of the series variable resistors 51 and 52 remain held at the minimum level; as a result, the magnitude of the output signal $P_{OUT}$ reaches maximum. At this point, the gain control width of this attenuator is 71 dB. If a voltage greater than 1.8 V is applied to the gain control voltage application terminal 19, the resistance values $R_{ON}$ (T-FET21) and $R_{ON}$ (T-FET25) of the series variable resistors 51 and 52 remain minimum and the resistance value $R_{ON}$ (S-FET16, 28) of the parallel variable resistors 53 and 54 remains maximum, so that the magnitude of the output signal $P_{OUT}$ remains maximum.

As described above, according to this embodiment, the attenuator is constructed by connecting the series variable resistors 51 and 52, each implemented by a field effect transistor, in a multiple stage configuration with the capacitor 24 interposed therebetween, and the operation points of the series variable resistors 51 and 52 are displaced from each other by an amount corresponding to the width of the linear gain control operation range; as a result, since the linear operation ranges of the series variable resistors 51 and 62 can be concatenated, the gain control amount can be controlled linearly over a wide range by the control voltage. Displacing the operation points of the series variable resistors 51 and 52 by an amount corresponding to the width of the linear gain control operation range can be accomplished by adjusting the respective reference voltages using an external microcomputer.

Figure 20:
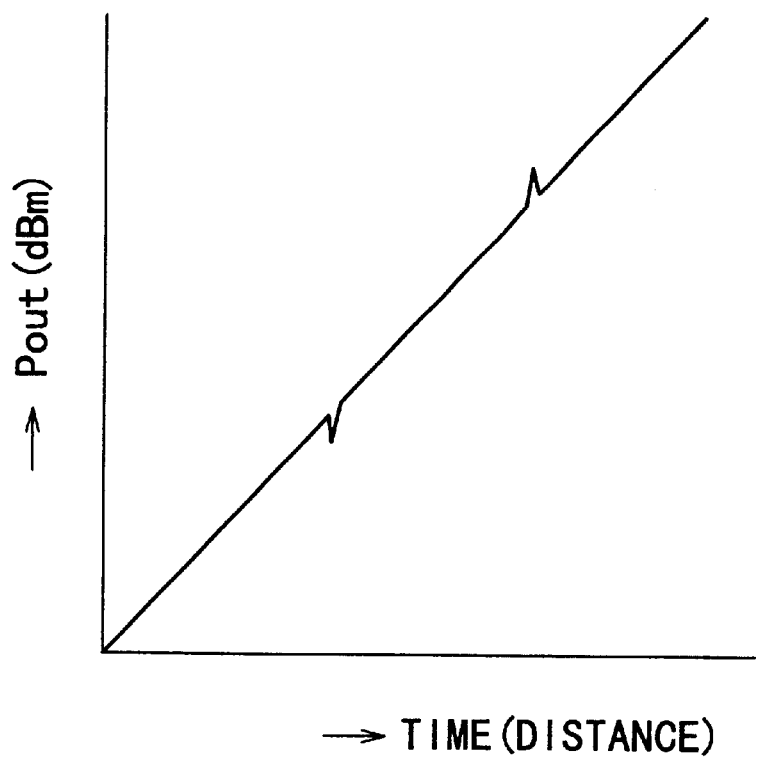
FIG. 20 is an explanatory diagram for explaining a problem associated with the prior art.

Accordingly, in the radio frequency section of the cellular mobile telephone terminal, gain control with a flatness of ±1 dB can be achieved using a single semiconductor device. Since the need for step-like switching of the control voltage, as required in the prior art, is eliminated, it becomes possible to avoid the instantaneous excursions from the output level target value of the power amplifier which occur due to the switching of the control step as explained with reference to FIG. 20; this serves to enhance the accuracy of the gain control performed in the cellular mobile telephone terminal. Furthermore, since the gain control is accomplished using only one gain control voltage, the circuit configuration of the control section 120 can be simplified. Moreover, since the variable gain intermediate frequency amplifier in the intermediate frequency section 260 can be omitted, a space saving design is achieved, contributing to further reducing the size of the cellular mobile telephone terminal.

Figure 5:
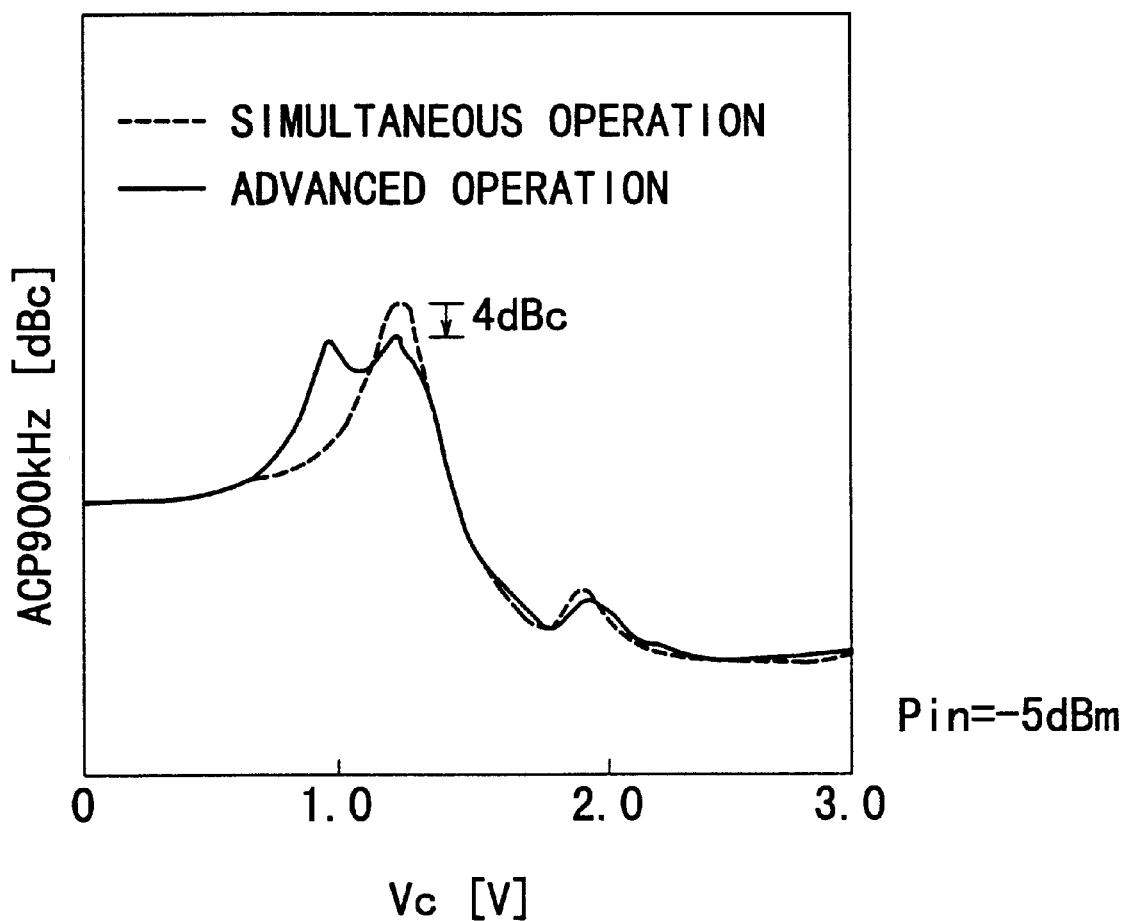
FIG. 5 is a diagram showing the gain control voltage versus 900 kHz adjacent channel leakage power in the attenuator of FIG. 2.

In CDMA systems, since all signals are handled in the same time and frequency domains by assigning a unique code to each signal, device distortion characteristics become an extremely important factor. Specifically, in the above embodiment, the operation points of the series variable resistors 51 and 52 formed from field effect transistors are displaced from each other by an amount corresponding to the width of the linear gain control operation range in such a manner that the series variable resistor 52 at the output side is put into operation in advance of the series variable resistor 51 at the input side in response to the gain control voltage Vc1; this offers the effect of being able to spread out the degradation points of the distortion characteristics of the input side series variable resistor 51, output side series variable resistor 52, and parallel variable resistors 53 and 54, eliminating the possibility of the superimposition of degraded distortion power. As a result, degradation of the distortion characteristics can be prevented by combining the above control operation with the operation of the parallel variable resistors 53 and 54. As shown in FIG. 5, compared with the case where the series variable resistors 51 and 52 are operated simultaneously in a similar configuration, the distortion characteristic improves by about 4 dBc in terms of adjacent channel leakage power at 900 kHz detuning (ACP 900 kHz)

In the above embodiment, the operation points of the series variable resistors 51 and 52 formed from field effect transistors are displaced from each other in such a manner that the output side series variable resistor 52 is operated in advance of the input side series variable resistor 51 in response to the gain control voltage Vc1, but it will be appreciated that similar characteristics can be obtained if the input side series variable resistor 51 is operated first. This provides greater freedom when setting the control voltage in microcomputer logic blocks.

Figure 6:
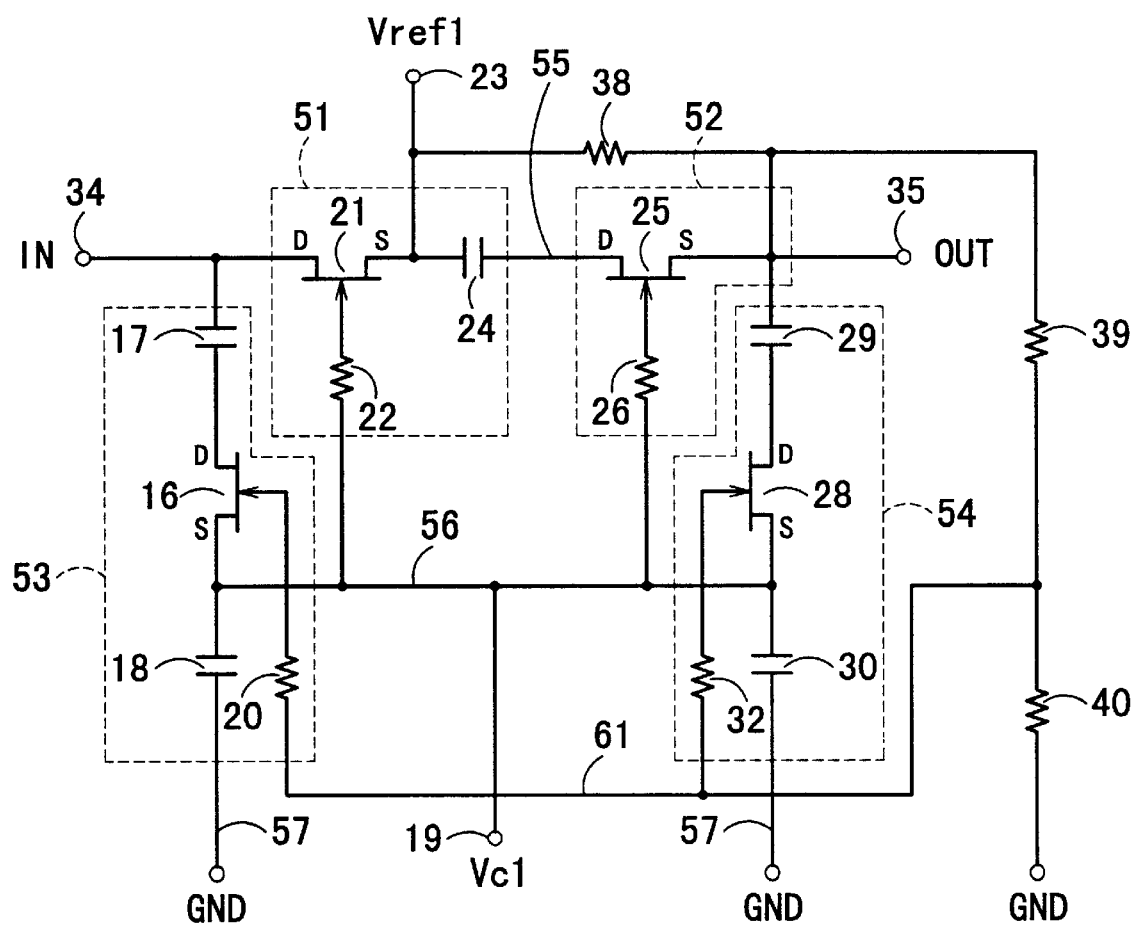
FIG. 6 is a circuit diagram showing the detailed configuration of the attenuator in FIG. 3 when bias resistors 38, 39, and 40 are provided so that reference voltages can be applied to respective variable resistors.

Furthermore, in the above embodiment, the reference voltage application terminals 23 and 27 are provided for the input side series variable resistor 51 and the output side series variable resistor 52, respectively, and the reference voltage application terminals 31 and 33 are provided for the parallel variable resistors 53 and 54, respectively, but instead, the reference voltages may be applied through bias resistors 38, 39, and 40, as shown in FIG. 6. In this case, the circuit configuration can be simplified since only one reference voltage application terminal is used. The bias resistors 38, 39, and 40 each act to block the infiltration of radio frequency signals. Each of the bias resistors 38, 39, and 40 is chosen to have a resistance value not smaller than about 5 kΩ but not larger than 100 kΩ in order to block the infiltration of radio frequency signals.

The reason why each of the bias resistors 38, 39, and 40 should be chosen to have a resistance value not smaller than about 5 kΩ but not larger than 100 kΩ will be described below.

First, the reason for setting the lower limit value at 5 kΩ is as follows. The bias resistor 38 and the field effect transistor 25 are connected in parallel, and the gain is controlled by varying the resistance of the field effect transistor 25. Now, suppose that the resistance value of the bias resistor 38 is smaller than 5 kΩ; in that case, even if the resistance of the field effect transistor 25 is increased, the resistance across the parallel circuit of the bias resistor 38 and field effect transistor 25 cannot be made larger than about 5 kΩ, as a result of which the gain control width decreases and the gain cannot be controlled with high accuracy. That is, infiltration of radio frequency signals cannot be prevented. Further, if the resistance values of the bias resistors 39 and 40 are also small, radio frequency signals would pass to ground; therefore, a resistance of 5 kΩ or larger (isolation of 40 dB or larger) is needed. Also, when the reference voltage Vref1 is 3 V, the current flowing through the bias resistors 38, 39, and 40 is $$I = 3 \text{ V}/15 \text{ k}\Omega = 200 \text{ }\mu\text{A}$$

or larger, increasing power consumption.

Next, the reason for setting the upper limit value at 100 kμ is as follows. When the reference voltage Vref1 is 3 V, the current flowing through the bias resistors 38, 39, and 40 is $$I = 3 \text{ V}/300 \text{ k}\Omega = 10 \text{ }\mu\text{A}$$

Now, the voltage across the bias resistor 38 is $$V = 10 \text{ }\mu\text{A} \times 100 \text{ k}\Omega = 1 \text{ V}$$

At this time, if a leakage current of 1 μA flowed through the field effect transistor, a bias variation of 1 μA×100 kΩ=0.1 V occurs; as a result, the gain control characteristic is shifted and accurate gain control cannot be performed.

Figure 7:
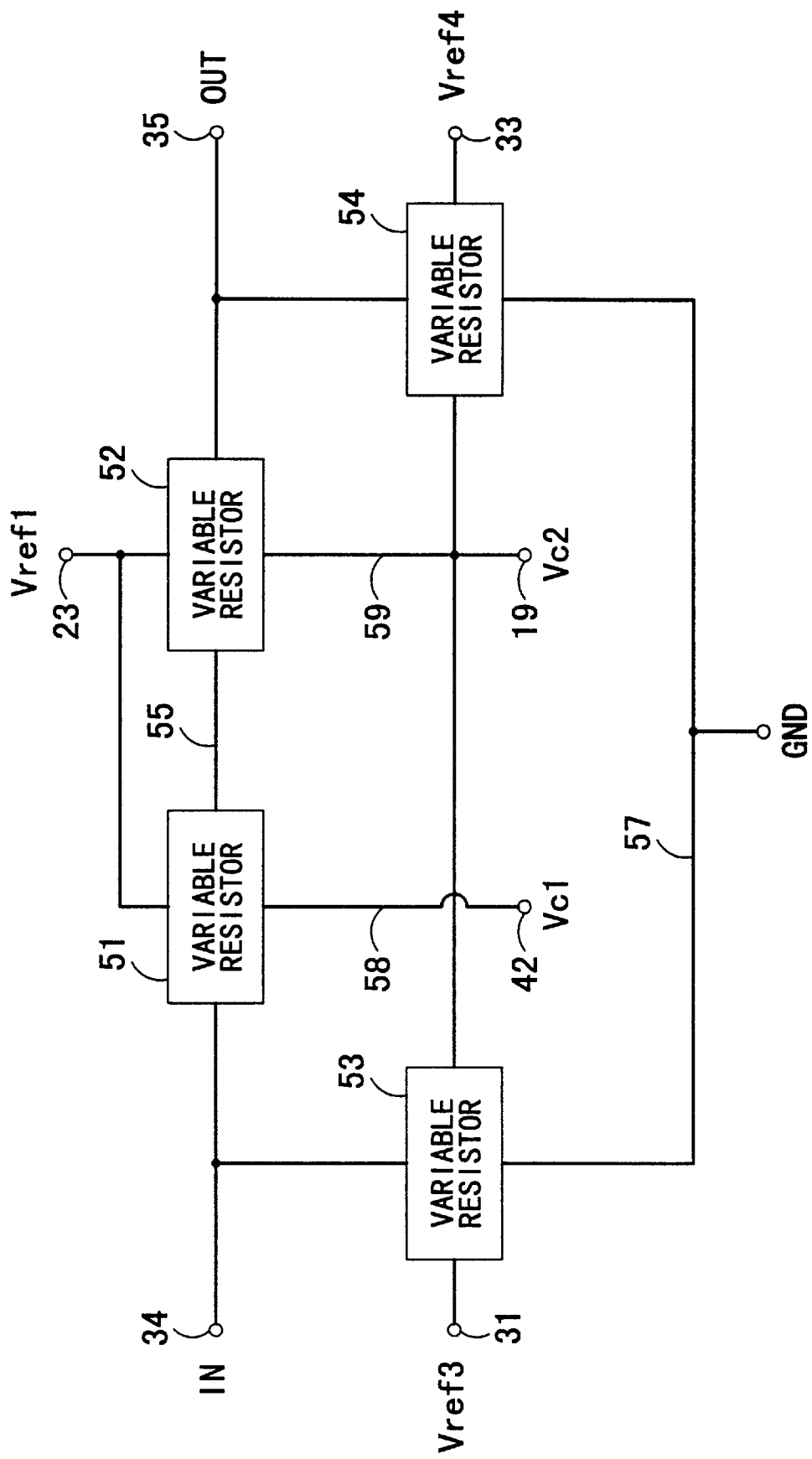
FIG. 7 is a block diagram showing the configuration of an attenuator in a cellular mobile telephone terminal according to a second embodiment of the present invention.
Figure 8:
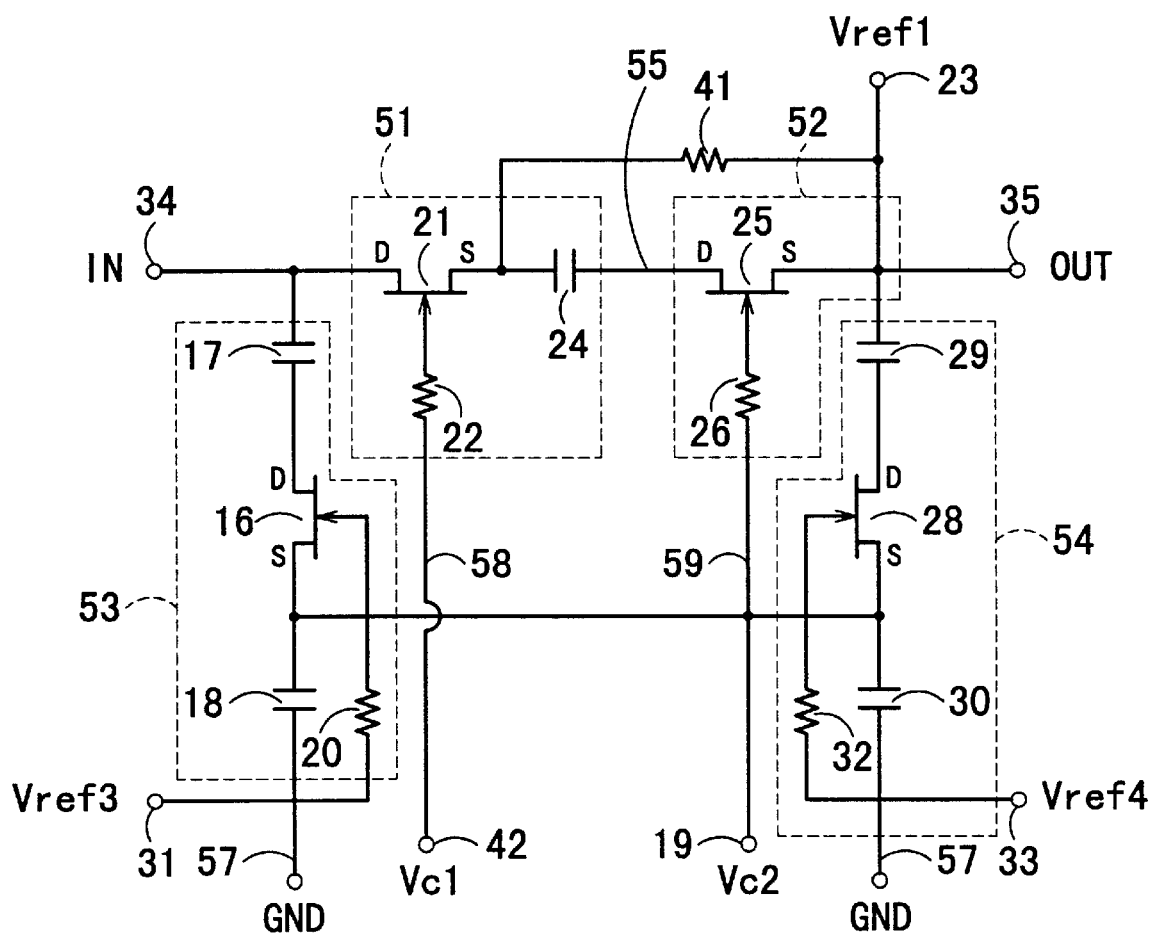
FIG. 8 is a circuit diagram showing the detailed configuration of the attenuator of FIG. 7.

Further, in the above embodiment, the reference voltage application terminals 23 and 27 are provided so that different voltages can be applied to the source electrodes of the field effect transistors acting as the series variable resistors 51 and 52, respectively, but instead, as shown in FIGS. 7 and 8 (second embodiment), gain control voltage application parts 42 and 19 may be provided for the series variable resistors 51 and 52 so that gain control voltages Vc1 and Vc2, one differing from the other by a value corresponding to the width of the linear gain control operation range, can be applied to the gates of the respective field effect transistors.

In FIGS. 7 and 8, reference numeral 58 indicates the first gain control line, and 59 the second gain control line.

In this configuration, the gain control voltage Vc1 applied to the gain control voltage application part 42 need only be set higher than the gain control voltage Vc2 applied to the gain control voltage application part 19 by a value corresponding to the width of the linear gain control operation range, and this eliminates the need for complicated voltage setting as required in the prior art configuration that uses a plurality of different gain control devices. Furthermore, since the same reference voltage Vref1 is applied to the source electrodes of the field effect transistors 21 and 25 acting as the series variable resistors 51 and 52, accurate and linear gain control can be achieved despite fluctuations in the reference voltage Vref1. A resistor 41, inserted between the reference voltage application terminal 23 and the source electrodes of the field effect transistors 21 and 25 acting as the series variable resistors 51 and 52, serves to block radio frequency signals, and is chosen to have a resistance value not smaller than about 5 kÜ but not larger than 100 k$\Omega$.

The reason why the resistor 41 should be chosen to have a resistance value not smaller than about 5 k$\Omega$ but not larger than 100 k$\Omega$ will be described below.

First, the reason for setting the lower limit value at 5 k$\Omega$ is as follows. The resistor 41 and the field effect transistor 25 are connected in parallel, and the gain is controlled by varying the resistance of the field effect transistor 25. Now, suppose that the resistance value of the resistor 41 is smaller than 5 k$\Omega$; in that case, even if the resistance of the field effect transistor 25 is increased, the resistance across the parallel circuit of the resistor 41 and field effect transistor 25 cannot be made larger than about 5 k$\Omega$, as a result of which the gain control width decreases and the gain cannot be controlled with high accuracy. That is, infiltration of radio frequency signals cannot be prevented.

Next, the reason for setting the upper limit value at 100 k$\Omega$ is as follows. If a leakage current (about 1 $\mu$A) flows through the field effect transistor, the potential difference across the resistor 41 would exceed $$V = 1\ \mu A \times 100\ k\Omega = 0.1\ V$$

thus resulting in a bias variation and rendering accurate gain control impossible.

Figure 9:
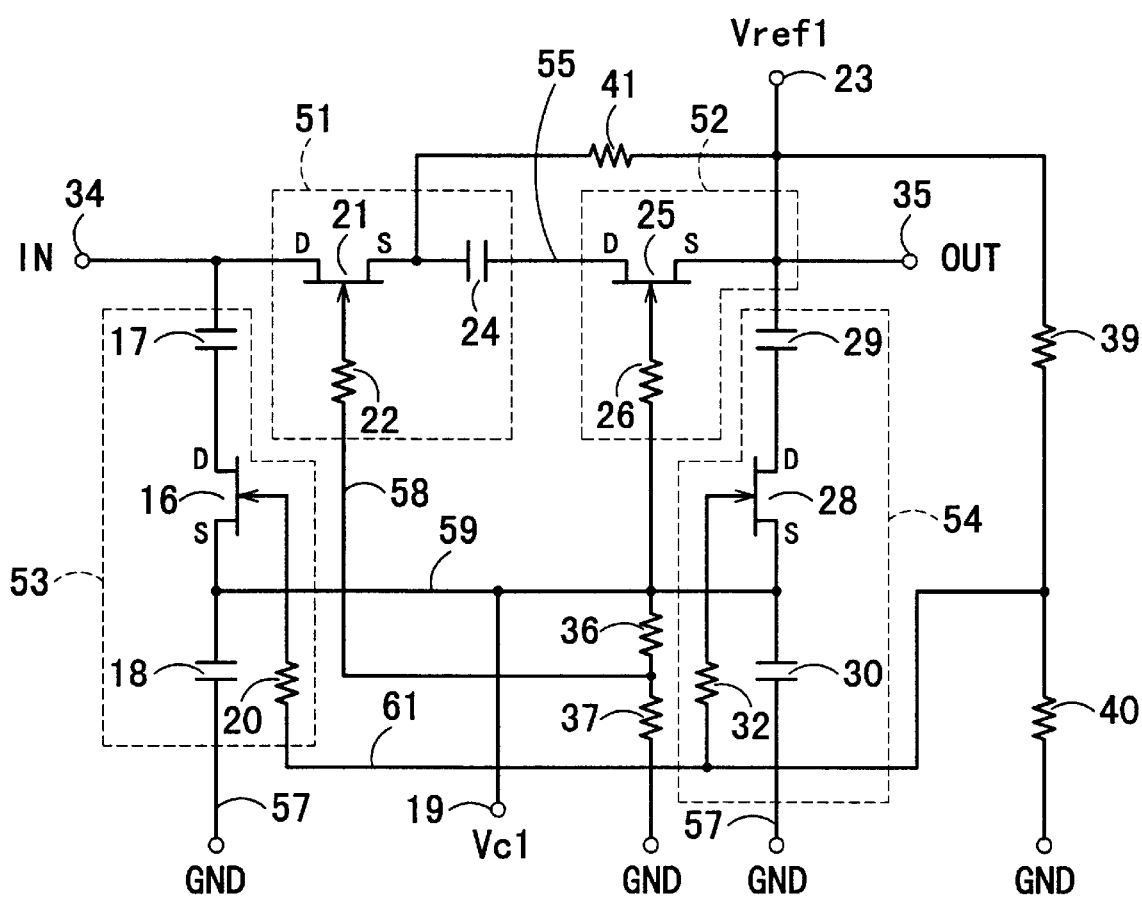
FIG. 9 is a circuit diagram showing the detailed configuration of the attenuator in FIG. 8 when bias resistors 36 and 37 are provided so that different voltages can be applied to the control gates of field effect transistors 21 and 25 forming series variable resistors, and bias resistors 41, 39, and 40 are provided so that reference voltages can be applied to the respective variable resistors.

Likewise, as shown in FIG. 9, bias resistors 36 and 37 may be provided so that voltages, one differing from the other by a value corresponding to the width of the linear gain control operation range, can be applied to the gates of the respective field effect transistors 21 and 25 acting as the series variable resistors 51 and 52. In this case, microcomputer logic setting can be simplified since only one gain control voltage Vc1 is used; furthermore, since the same reference voltage is applied to the source electrodes of the field effect transistors 21 and 25 acting as the series variable resistors 51 and 52, accurate and linear gain control can be achieved even despite fluctuations in the reference voltage. For the reference voltage also, the voltage may be applied through bias resistors 41, 39, and 40. In this case, the circuit configuration can be simplified since only one reference voltage application terminal needs to be provided. The bias resistors 41, 39, and 40 each act to prevent the infiltration of radio frequency signals. Each of the bias resistors 41, 39, and 40 is chosen to have a resistance value not smaller than about 5 k$\Omega$ but not larger than 100 k$\Omega$ in order to block the penetration of radio frequency signals. The reason for setting the resistance value within this range is the same as that described with reference to FIG. 6.

Figure 10:
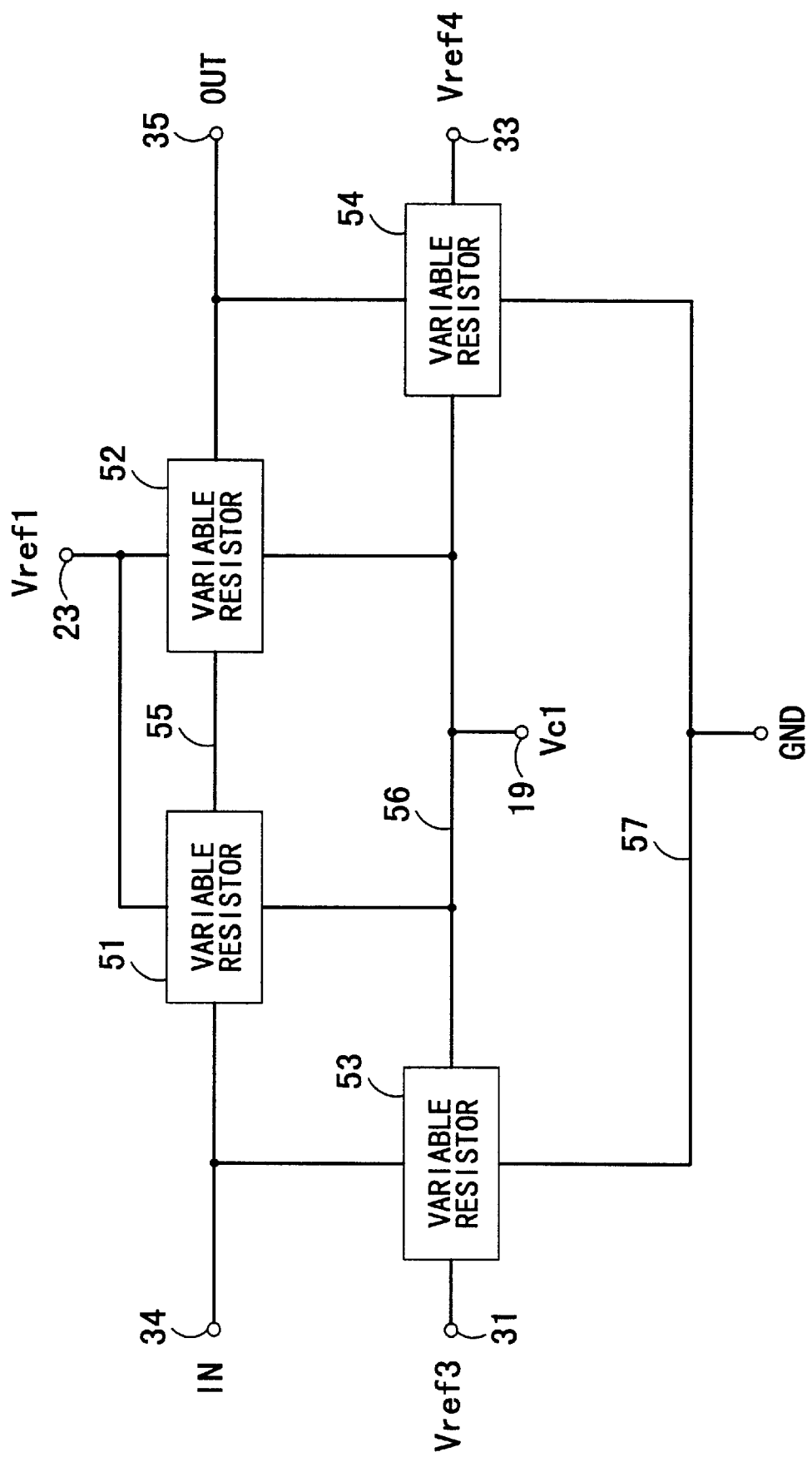
FIG. 10 is a block diagram showing the configuration of an attenuator in a cellular mobile telephone terminal according to a third embodiment of the present invention.
Figure 11:
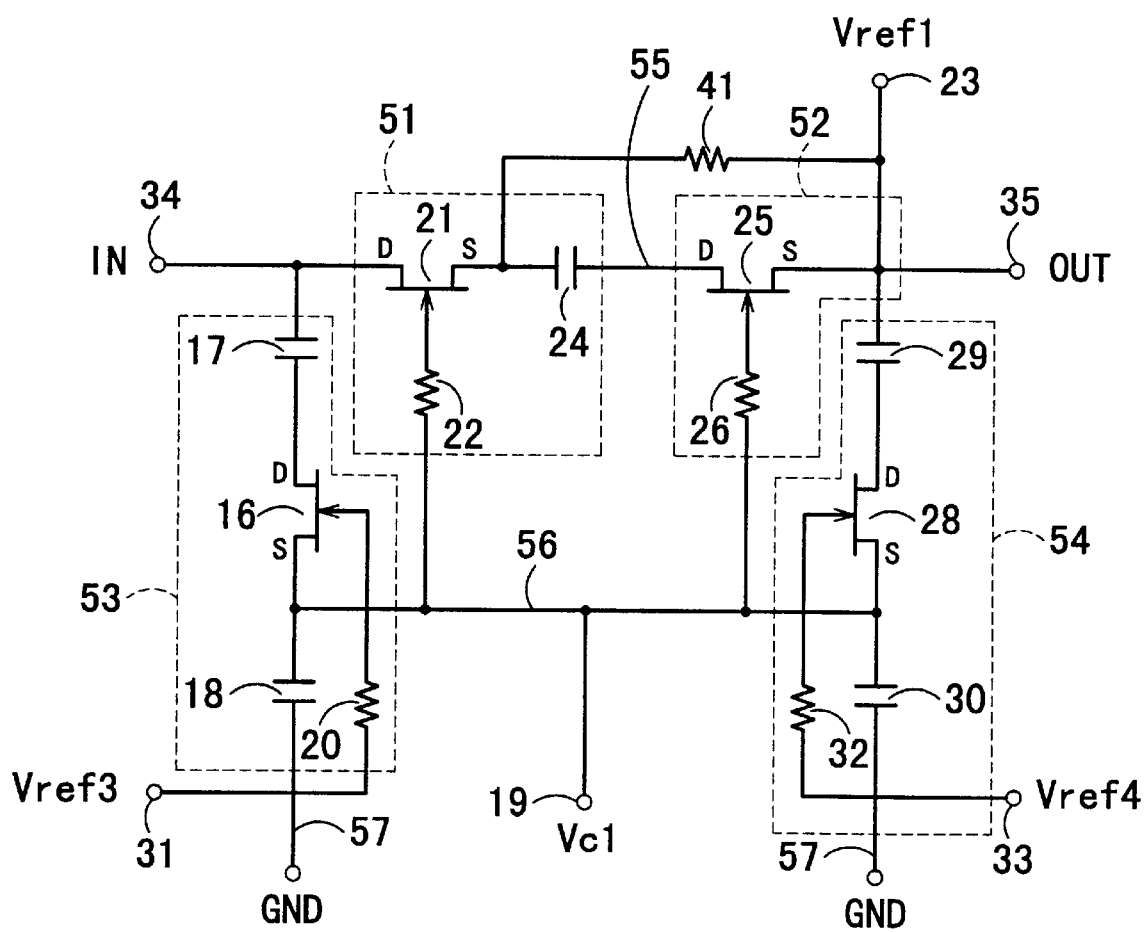
FIG. 11 is a circuit diagram showing the detailed configuration of the attenuator of FIG. 10.
Figure 13:
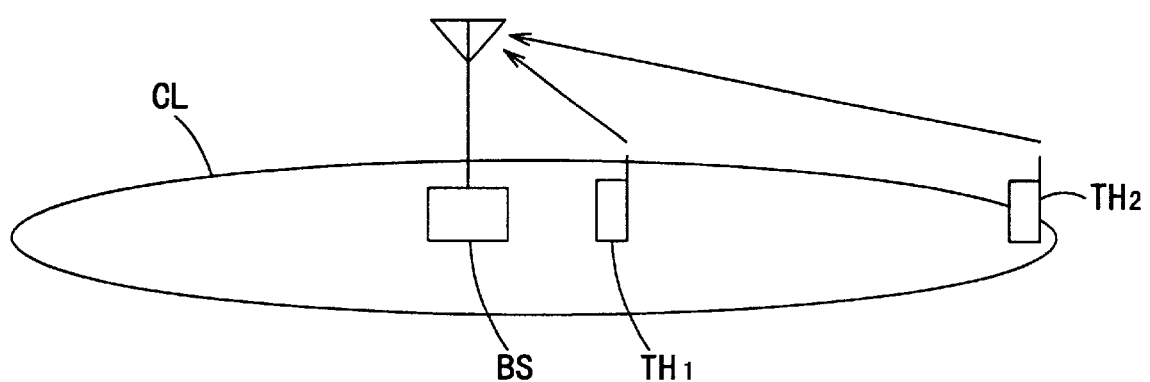
FIG. 13 is a schematic diagram showing the relationship of the locations of cellular mobile telephone terminals relative to a base station.
Figure 15:
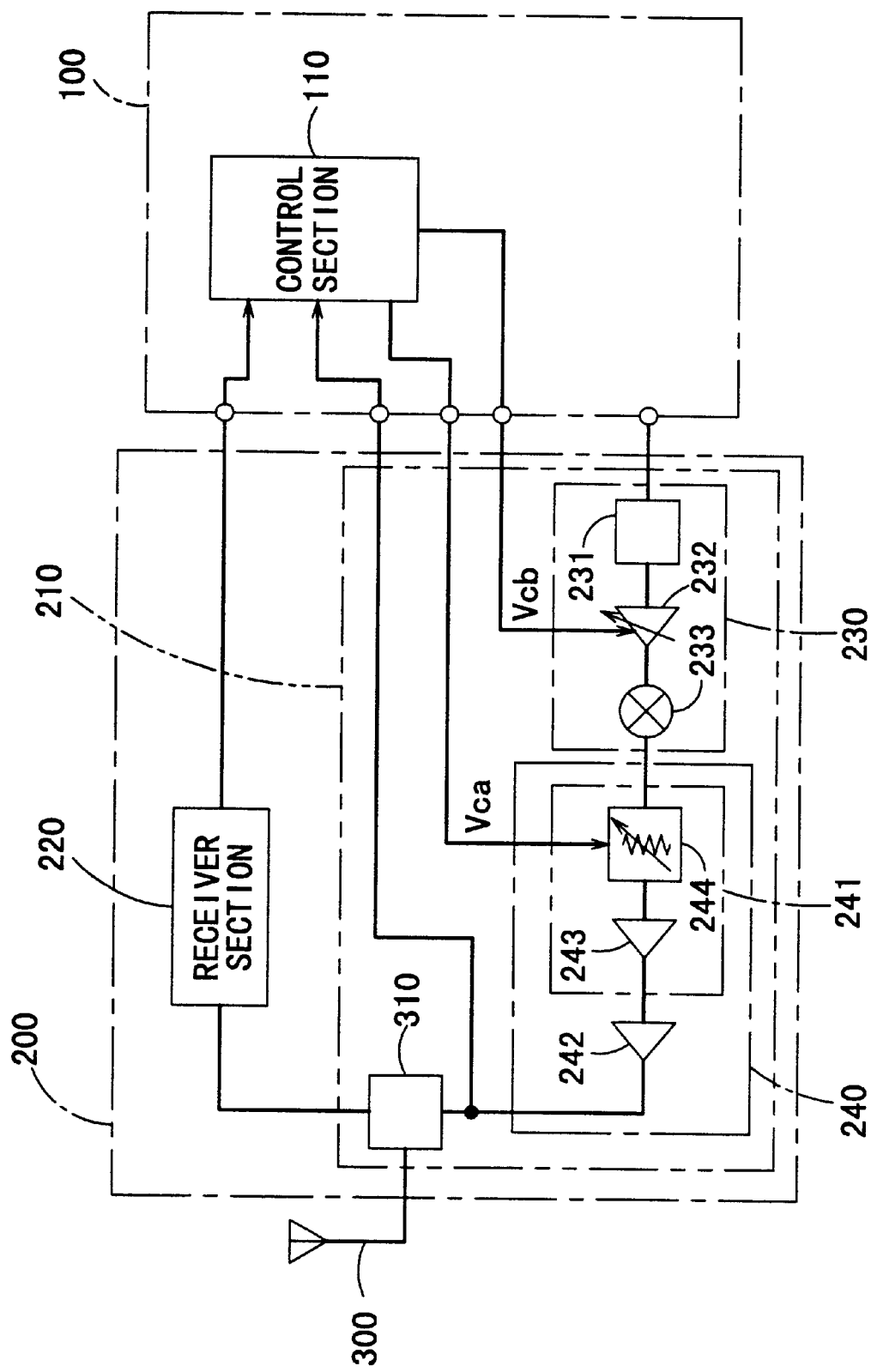
FIG. 15 is a block diagram showing the configuration of a prior art cellular mobile telephone terminal.
Figure 16:
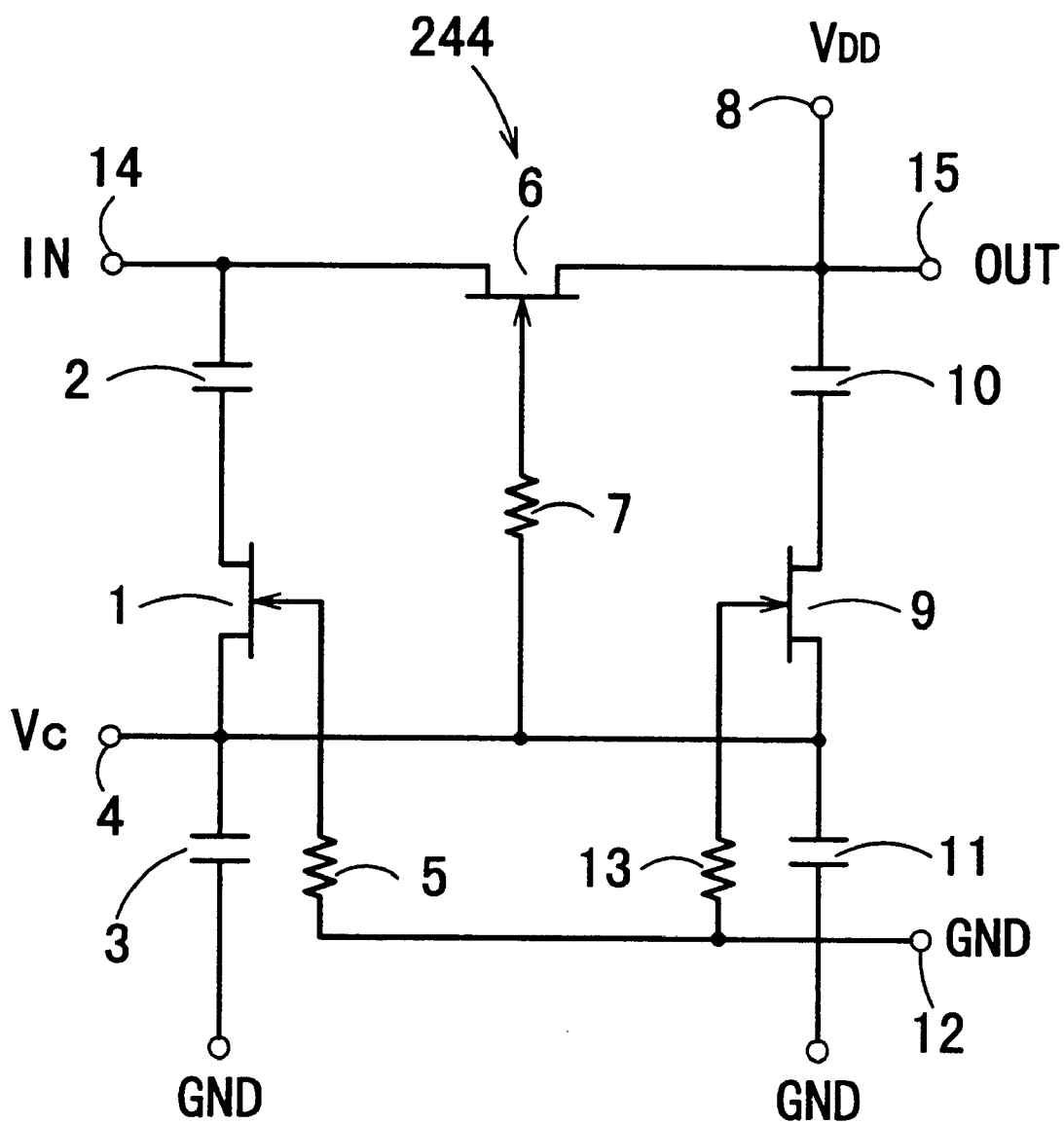
FIG. 16 is a circuit diagram showing the configuration of an attenuator used in the cellular mobile telephone terminal of FIG. 15.
Figure 17:
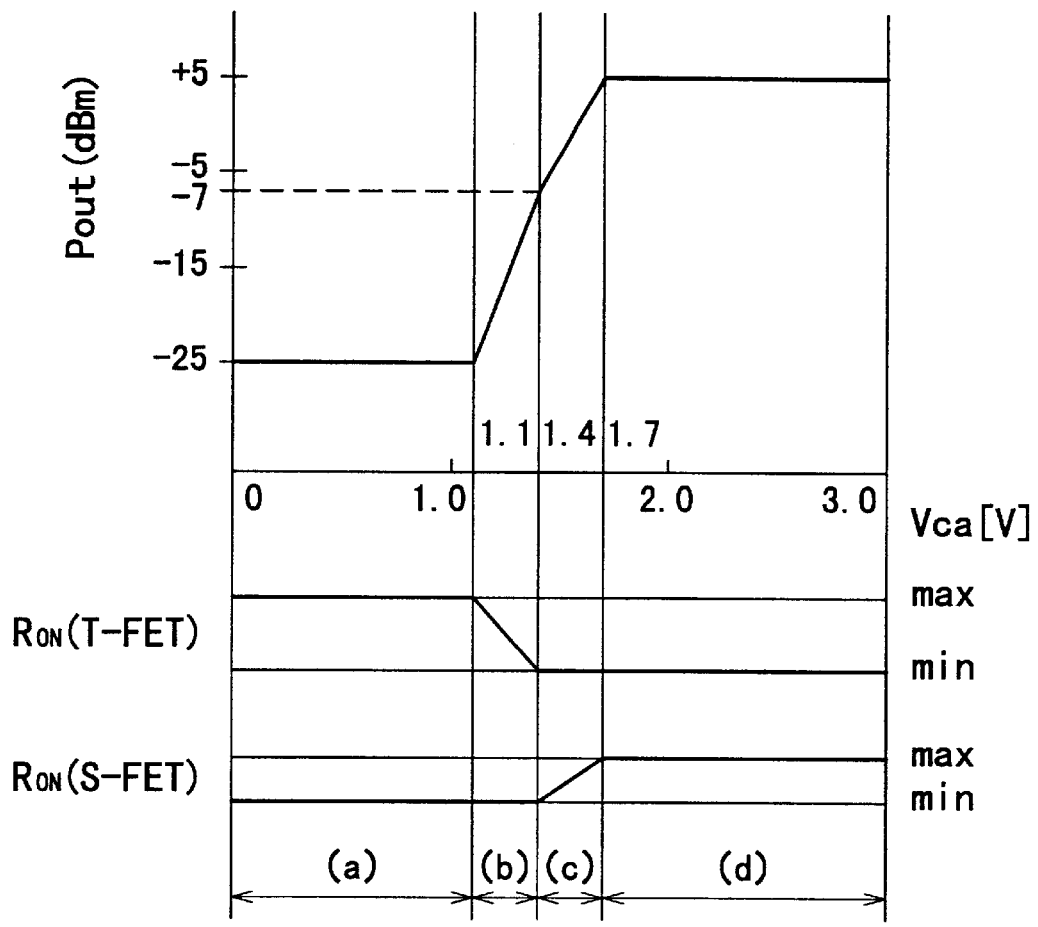
FIG. 17 is a diagram showing the gain control voltage versus gain control characteristic of the attenuator of FIG. 16.
Figure 18:
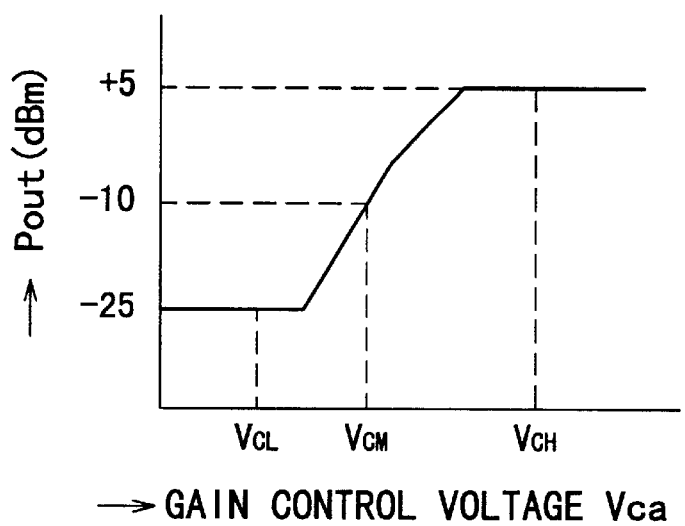
FIG. 18 is a characteristic diagram showing the output level of a gain controller relative to a gain control voltage.
Figure 19:
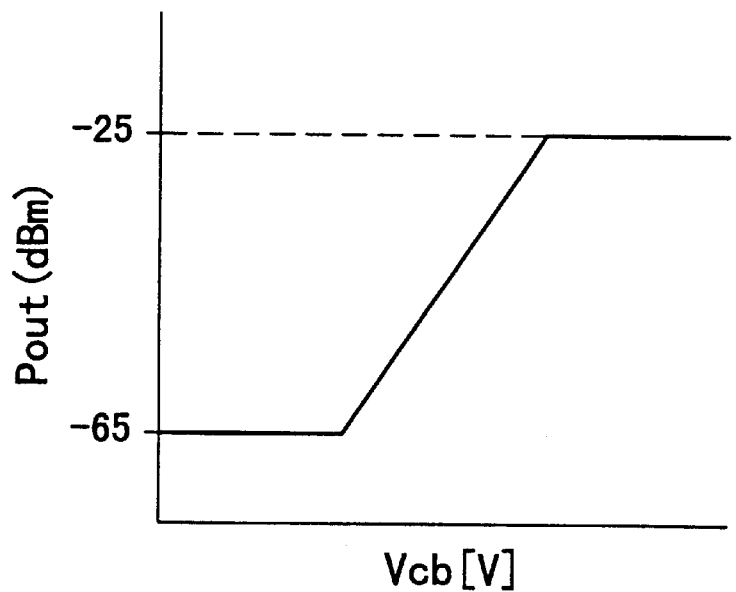
FIG. 19 is a characteristic diagram showing the output level of a variable gain intermediate frequency amplifier relative to a gain control voltage.

Further, in the above second embodiment, the reference voltage application terminals 23 and 27 are provided so that different voltages can be applied to the source electrodes of the field effect transistors 21 and 25 acting as the series variable resistors 51 and 52, respectively, but alternatively, the same reference voltage and the same gain control voltage may be applied to the field effect transistors 21 and 25 acting as the series variable resistors 51 and 52, as shown in FIG. 10 or 11, and the displacement of their operation points may be accomplished by constructing the field effect transistors 21 and 25 from field effect transistors whose threshold voltages are different by a value corresponding to the width of the linear gain control operation voltage range (third embodiment). In this case, while the number of processing steps increases, the number of voltage application terminals can be reduced, and the circuit configuration can thus be simplified, as shown in FIGS. 10 and 11. Further, since the same reference voltage is applied to the source electrodes of the field effect transistors 21 and 25 acting as the series variable resistors 51 and 52, accurate and linear gain control can be achieved despite fluctuations in the reference voltage. The resistor 41, inserted between the reference voltage application terminal 23 and the source electrodes of the field effect transistors 21 and 25 acting as the series variable resistors 51 and 52, serves to prevent the infiltration of radio frequency signals.

Furthermore, as shown in FIG. 12, the reference voltage may be applied through the bias resistors 41, 39, and 40. In this case, the circuit configuration can be further simplified since only one reference voltage application terminal needs to be provided. The bias resistors 41, 39, and 40 each act to block the infiltration of radio frequency signals.

Each of the above embodiments has employed a configuration in which two variable resistors, the series variable resistor 51 at the input side and the series variable resistor 52 at the output side, each implemented by a field effect transistor, are connected in a multiple stage configuration, but it will be recognized that a larger number of variable resistors may be connected in a multiple stage configuration; as the number of variable resistors connected in series in the multiple stage configuration increases, the linear signal control voltage range for the control voltage can be increased correspondingly, because the linear operation ranges of the series variable resistors can be concatenated.

Further, in the above embodiments, no components have been inserted in parallel with the drain/source electrodes of the field effect transistors 21, 25, 16, and 28 forming the variable resistors 51, 52, 53, and 54, but in order to suppress variations in resistivity among the field effect transistors 21, 25, 16, and 28 and to control the variable resistance range of each transistor, a resistor or like component may be inserted in parallel with the drain/source electrodes of each of the field effect transistors 21, 25, 16, and 28. This serves to stabilize the gain control amount of each variable resistor, and achieves extremely accurate gain control.

In the above embodiments, the field effect transistors 21, 25, 16, and 28 acting as the variable resistors 51, 52, 53, and 54 are each configured to have a single gate, but transistors having two or more gates (multi-gate type) may be used; as the number of gates increases, the gain increases and, even for high frequency input signals, the gain can be controlled while suppressing degradation of the distortion characteristic.

When the field effect transistors 21, 25, 16, and 28 forming the variable resistors 51, 52, 53, and 54 are all of the single-gate type, the field effect transistors 21, 25, 16, and 28 need not necessarily be chosen to have the same gate width, but if they are chosen to have the same gate width, the combined gain control characteristic of the two parallel variable resistors 53 and 54 can be made to match the gain control characteristic of each of the two series variable resistors 51 and 52, and the linearity of the gain control can be greatly enhanced.

Furthermore, the above embodiments have each dealt with the configuration in which the field effect transistors 21, 25, 16, and 28 are used for the variable resistors 51, 52, 53, and 54, but the present invention is not limited to this particular configuration; for example, other devices such as diodes may be used.

The attenuators so far described can be applied not only to CDMA systems but also to various other mobile communication systems (PDC, GSM, PCS, Wideband-CDMA, DCS, PHS, etc.).

What is claimed is:

1. A cellular mobile telephone terminal comprising a baseband section (101) for processing a voice signal and a radio transceiver section (210) for taking as an input the voice signal processed by said baseband section (101) and for performing communications with a base station, wherein said radio transceiver section (201) comprises a transmitter section (250) for generating a signal for transmission to said base station and a receiver section (220) for receiving a signal transmitted from said base station, said transmitter section (250) comprising an intermediate frequency section (260) for performing heterodyning for modulation and frequency conversion of the voice signal supplied from said baseband section (101) and a radio frequency section (270) for amplifying a radio frequency signal output from said intermediate frequency section (260) and for supplying said amplified signal to an antenna, said radio frequency section (270) comprising a gain controller (271) for controlling the gain of said radio frequency signal output from said intermediate frequency section (260) and a power amplifier (242) for amplifying the power of an output of said gain controller (271), and wherein:

said baseband section (101) includes a control section, and said control section detects the output level of said power amplifier (242) while also detecting signal strength of the signal received by said receiver section (220), sets an output level target value for said power amplifier (242) based on the signal strength of said received signal, compares the output level of said power amplifier (242) with said output level target value of said power amplifier (242), and applies to said gain controller (271) a gain control voltage responsive to the result of said comparison, thereby controlling the gain of said gain controller (271) in a feedback loop so that the output level of said power amplifier (242) matches said output level target value of said power amplifier (242); and said gain controller (271) comprises: a signal line (55) containing at least two series variable resistors (51) and (52) and connecting between a signal input part (34) and signal output part (35) for said radio frequency signal; and parallel variable resistors (53) and (54) connected between a groundline (57) and said signal input part (34) and signal output part (35), respectively, wherein said gain controller (271) controls the output of said power amplifier (242) linearly and in substantially continuous fashion by controlling the gain of each of said variable resistors (51), (52), (53), and (54) through said gain control voltage which is applied to a gain control voltage application part (19).

2. A cellular mobile telephone terminal comprising a baseband section (101) for processing a voice signal and a radio transceiver section (210) for taking as an input the voice signal processed by said baseband section (101) and for performing communications with a base station, wherein said radio transceiver section (201) comprises a transmitter section (250) for generating a signal for transmission to said base station and a receiver section (220) for receiving a signal transmitted from said base station, said transmitter section (250) comprising an intermediate frequency section (260) for performing heterodyning for modulation and frequency conversion of the voice signal supplied from said baseband section (101) and a radio frequency section (270) for amplifying a radio frequency signal output from said intermediate frequency section (260) and for supplying said amplified signal to an antenna, said radio frequency section (270) comprising a gain controller (271) for controlling the gain of said radio frequency signal output from said intermediate frequency section (260) and a power amplifier (242) for amplifying the power of an output of said gain controller (271), and wherein:

said baseband section (101) includes a control section, and said control section detects the output level of said power amplifier (242) while also detecting signal strength of the signal received by said receiver section (220), sets an output level target value for said power amplifier (242) based on the signal strength of said received signal, compares the output level of said power amplifier (242) with said output level target value of said power amplifier (242), and applies to said gain controller (271) a gain control voltage responsive to the result of said comparison, thereby controlling the gain of said gain controller (271) in a feedback loop so that the output level of said power amplifier (242) matches said output level target value of said power amplifier (242); and said gain controller (271) comprises: a signal line (55) containing at least two series variable resistors (51) and (52) and connecting between a signal input part (34) and signal output part (35) for said radio frequency signal; parallel variable resistors (53) and (54) connected between a ground line (57) and said signal input part (34) and signal output part (35), respectively; a gain control line (56) connected to said variable resistors (51), (52), (53), and (54); reference voltage application parts (23), (27), (31), and (33) connected to said variable resistors (51), (52), (53), and (54), respectively; and a gain control voltage application part (19) connected to each of said variable resistors (51), (52), (53), and (54) via said gain control line (56) for application of said gain control voltage.

3. A cellular mobile telephone terminal according to claim 2, wherein said variable resistors (51), (52), (53), and (54) are formed at least from field effect transistors (21), (25), (16), and (28) whose gates are connected to resistors (22), (26), (20), and (32), respectively, and wherein: the gates of said field effect transistors (21) and (25) forming said variable resistors (51) and (52) are connected to said gain control voltage application part (19) via said resistors (22) and (26), respectively, and via said gain control line (56); the gates of said field effect transistors (16) and (28) forming said variable resistors (53) and (54) are connected to said reference voltage application parts (31) and (33) via said resistors (20) and (32), respectively; the sources of said field effect transistors (21) and (25) forming said variable resistors (51) and (52) are connected to said reference voltage application parts (23) and (27), respectively, said variable resistors (51) and (52) being connected in series via a capacitor (24); the sources of said field effect transistors (16) and (28) forming said variable resistors (53) and (54) are connected to said gain control voltage application part (19) via said gain control line (56); the drains of said field effect transistors (16) and (28) forming said variable resistors (53) and (54) are connected via capacitors (17) and (29) to said signal input part (34) and said signal output part (35), respectively; and the sources of said field effect transistors (16) and (28) forming said variable resistors (53) and (54) are connected to a base potential part (GND) via capacitors (18) and (30), respectively, and via said ground line (57).

4. A cellular mobile telephone terminal according to claim 2, wherein a voltage applied to said reference voltage application part (23) is higher than a voltage applied to said reference voltage application part (27).

5. A cellular mobile telephone terminal according to claim 2, wherein a voltage applied to said reference voltage application part (23) is higher than a voltage applied to said reference voltage application part (27) by a value corresponding to a gain control voltage range where said variable resistor (52) performs a linear gain control operation.

6. A cellular mobile telephone terminal according to claim 2, wherein the values of voltages applied to said reference voltage application parts (31) and (33) are set so that a gain control voltage range where said variable resistors (53) and (54) perform a linear gain control operation becomes continuous with a gain control voltage range where said variable resistors (51) and (52) perform a linear gain control operation.

7. A cellular mobile telephone terminal according to claim 2, wherein said variable resistors (51), (52), (53), and (54) are formed at least from field effect transistors (21), (25), (16), and (28) whose gates are connected to resistors (22), (26), (20), and (32), respectively, and wherein: the gates of said field effect transistors (21) and (25) forming said variable resistors (51) and (52) are connected to said gain control voltage application part (19) via said resistors (22) and (26), respectively, and via said gain control line (56); the gates of said field effect transistors (16) and (28) forming said variable resistors (53) and (54) are connected together via said resistors (20) and (32); a resistor (38) is inserted between the sources of said field effect transistors (21) and (25) forming said variable resistors (51) and (52); a resistor (39) is inserted between the source of said field effect transistor (25) forming said variable resistor (52) and a part (61) connected via said resistors (20) and (32) to the gates of said field effect transistors (16) and (28) forming said variable resistors (53) and (54); a resistor (40) is inserted between a base potential part (GND) and said part (61) connected via said resistors (20) and (32) to the gates of said field effect transistors (16) and (28) forming said variable resistors (53) and (54); said reference voltage application part (23) is connected to the source of said field effect transistor (21) forming said variable resistor (51); said variable resistors (51) and (52) are connected in series via a capacitor (24); the sources of said field effect transistors (16) and (28) forming said variable resistors (53) and (54) are connected to said gain control voltage application part (19) via said gain control line (56); the drains of said field effect transistors (16) and (28) forming said variable resistors (53) and (54) are connected via capacitors (17) and (29) to said signal input part (34) and said signal output part (35), respectively; and the sources of said field effect transistors (16) and (28) forming said variable resistors (53) and (54) are connected to said base potential part (GND) via capacitors (18) and (30), respectively, and via said ground line (57).

8. A cellular mobile telephone terminal comprising a baseband section (101) for processing a voice signal and a radio transceiver section (210) for taking as an input the voice signal processed by said baseband section (101) and for performing communications with a base station, wherein said radio transceiver section (201) comprises a transmitter section (250) for generating a signal for transmission to said base station and a receiver section (220) for receiving a signal transmitted from said base station, said transmitter section (250) comprising an intermediate frequency section (260) for performing heterodyning for modulation and frequency conversion of the voice signal supplied from said baseband section (101) and a radio frequency section (270) for amplifying a radio frequency signal output from said intermediate frequency section (260) and for supplying said amplified signal to an antenna, said radio frequency section (270) comprising a gain controller (271) for controlling the gain of said radio frequency signal output from said intermediate frequency section (260) and a power amplifier (242) for amplifying the power of an output of said gain controller (271), and wherein:

said baseband section (101) includes a control section, and said control section detects the output level of said power amplifier (242) while also detecting signal strength of the signal received by said receiver section (220), sets an output level target value for said power amplifier (242) based on the signal strength of said received signal, compares the output level of said power amplifier (242) with said output level target value of said power amplifier (242), and applies to said gain controller (271) first and second gain control voltages responsive to the result of said comparison, thereby controlling the gain of said gain controller (271) in a feedback loop so that the output level of said power amplifier (242) matches said output level target value of said power amplifier (242); and said gain controller (271) comprises: a signal line (55) containing at least two series variable resistors (51) and (52) and connecting between a signal input part (34) and signal output part (35) for said radio frequency signal; parallel variable resistors (53) and (54) connected between a ground line (57) and said signal input part (34) and signal output part (35), respectively; a first gain control line (58) connected to said variable resistor (51); a gain control voltage application part (42) connected to said variable resistor (51) via said first gain control line (58) for application of said first gain control voltage; a second gain control line (59) connected to said variable resistors (52), (53), and (54); a gain control voltage application part (19) connected to said variable resistors (52), (53), and (54) via said second gain control line (59) for application of said second gain control voltage; a reference voltage application part (23) connected to said variable resistors (51) and (52); and reference voltage application parts (31) and (33) connected to said variable resistors (53) and (54), respectively.

9. A cellular mobile telephone terminal according to claim 8, wherein said variable resistors (51), (52), (53), and (54) are formed at least from field effect transistors (21), (25), (16), and (28) whose gates are connected to resistors (22), (26), (20), and (32), respectively, and wherein: the gate of said field effect transistor (21) forming said variable resistor (51) is connected to said gain control voltage application part (42) via said resistor (22) and via said first gain control line (58); the gate of said field effect transistor (25) forming said variable resistor (52) is connected to said gain control voltage application part (19) via said resistor (26) and via said second gain control line (59); the gates of said field effect transistors (16) and (28) forming said variable resistors (53) and (54) are connected to said reference voltage application parts (31) and (33) via said resistors (20) and (32), respectively; a resistor (41) is inserted between the sources of said field effect transistors (21) and (25) forming said variable resistors (51) and (52); the source of said variable resistor (52) is connected to said reference voltage application part (23); said variable resistors (51) and (52) are connected in series via a capacitor (24); the sources of said field effect transistors (16) and (28) forming said variable resistors (53) and (54) are connected to said gain control voltage application part (19) via said second gain control line (59); the drains of said field effect transistors (16) and (28) forming said variable resistors (53) and (54) are connected via capacitors (17) and (29) to said signal input part (34) and said signal output part (35), respectively; and the sources of said field effect transistors (16) and (28) forming said variable resistors (53) and (54) are connected to said base potential part (GND) via capacitors (18) and (30), respectively, and via said ground line (57).

10. A cellular mobile telephone terminal according to claim 8, wherein a voltage applied to said gain control voltage application part (19) is higher than a voltage applied to said gain control voltage application part (42).

11. A cellular mobile telephone terminal according to claim 8, wherein a voltage applied to said gain control voltage application part (19) is higher than a voltage applied to said gain control voltage application part (42) by a value corresponding to a gain control voltage range where said variable resistor (52) performs a linear gain control operation.

12. A cellular mobile telephone terminal according to claim 8, wherein the values of voltages applied to said reference voltage application parts (31) and (33) are set so that a gain control voltage range where said variable resistors (53) and (54) perform a linear gain control operation becomes continuous with a gain control voltage range where said variable resistors (51) and (52) perform a linear gain control operation.

13. A cellular mobile telephone terminal according to claim 8, wherein said variable resistors (51), (52), (53), and (54) are formed at least from field effect transistors (21), (25), (16), and (28) whose gates are connected to resistors (22), (26), (20), and (32), respectively, and wherein: the gate of said field effect transistor (21) forming said variable resistor (51) is connected to said gain control voltage application part (42) via said resistor (22) and via said first gain control line (58); the gate of said field effect transistor (25) forming said variable resistor (52) is connected to said gain control voltage application part (19) via said resistor (26) and via said second gain control line (59); the gates of said field effect transistors (16) and (28) forming said variable resistors (53) and (54) are connected together via said resistors (20) and (32); a resistor (41) is inserted between the sources of said field effect transistors (21) and (25) forming said variable resistors (51) and (52); a resistor (39) is inserted between the source of said field effect transistor (25) forming said variable resistor (52) and a part (61) connected via said resistors (20) and (32) to the gates of said field effect transistors (16) and (28) forming said variable resistors (53) and (54); a resistor (40) is inserted between a base potential part (GND) and said part (61) connected via said resistors (20) and (32) to the gates of said field effect transistors (16) and (28) forming said variable resistors (53) and (54); said reference voltage application part (23) is connected to the source of said field effect transistor (25) forming said variable resistor (52); said variable resistors (51) and (52) are connected in series via a capacitor (24); the sources of said field effect transistors (16) and (28) forming said variable resistors (53) and (54) are connected to said gain control voltage application part (19) via said second gain control line (59); the drains of said field effect transistors (16) and (28) forming said variable resistors (53) and (54) are connected via capacitors (17) and (29) to said signal input part (34) and said signal output part (35), respectively; and the sources of said field effect transistors (16) and (28) forming said variable resistors (53) and (54) are connected to said base potential part (GND) via capacitors (18) and (30), respectively, and via said ground line (57).

14. A cellular mobile telephone terminal comprising a baseband section (101) for processing a voice signal and a radio transceiver section (210) for taking as an input the voice signal processed by said baseband section (101) and for performing communications with a base station, wherein said radio transceiver section (201) comprises a transmitter section (250) for generating a signal for transmission to said base station and a receiver section (220) for receiving a signal transmitted from said base station, said transmitter section (250) comprising an intermediate frequency section (260) for performing heterodyning for modulation and frequency conversion of the voice signal supplied from said baseband section (101) and a radio frequency section (270) for amplifying a radio frequency signal output from said intermediate frequency section (260) and for supplying said amplified signal to an antenna, said radio frequency section (270) comprising a gain controller (271) for controlling the gain of said radio frequency signal output from said intermediate frequency section (260) and a power amplifier (242) for amplifying the power of an output of said gain controller (271), and wherein:

said baseband section (101) includes a control section, and said control section detects the output level of said power amplifier (242) while also detecting signal strength of the signal received by said receiver section (220), sets an output level target value for said power amplifier (242) based on the signal strength of said received signal, compares the output level of said power amplifier (242) with said output level target value of said power amplifier (242), and applies to said gain controller (271) a gain control voltage responsive to the result of said comparison, thereby controlling the gain of said gain controller (271) in a feedback loop so that the output level of said power amplifier (242) matches said output level target value of said power amplifier (242); and said gain controller (271) comprises: a signal line (55) containing at least two series variable resistors (51) and (52) and connecting between a signal input part (34) and signal output part (35) for said radio frequency signal; parallel variable resistors (53) and (54) connected between aground line (57) and said signal input part (34) and signal output part (35), respectively; a gain control line (56) connecting between said variable resistors (51), (52), (53), and (54); a gain control voltage application part (19) connected to said variable resistors (51), (52), (53), and (54) via said gain control line (56) for application of said gain control voltage; a reference voltage application part (23) connected to said variable resistors (51) and (52); and reference voltage application parts (31) and (33) connected to said variable resistors (53) and (54), respectively.

15. A cellular mobile telephone terminal according to claim 14, wherein said variable resistors (51), (52), (53), and

(54) are formed at least from field effect transistors (21), (25), (16), and (28) whose gates are connected to resistors (22), (26), (20), and (32), respectively, and wherein: the gates of said field effect transistors (21) and (25) forming said variable resistors (51) and (52) are connected to said gain control voltage application part (19) via said resistors (22) and (26), respectively, and via said gain control line (56); the gates of said field effect transistors (16) and (28) forming said variable resistors (53) and (54) are connected to said reference voltage application parts (31) and (33) via said resistors (20) and (32), respectively; a resistor (41) is inserted between the sources of said field effect transistors (21) and (25) forming said variable resistors (51) and (52); said reference voltage application part (23) is connected to the source of said variable resistor (52); said variable resistors (51) and (52) are connected in series via a capacitor (24); the sources of said field effect transistors (16) and (28) forming said variable resistors (53) and (54) are connected to said gain control voltage application part (19) via said gain control line (56); the drains of said field effect transistors (16) and (28) forming said variable resistors (53) and (54) are connected via capacitors (17) and (29) to said signal input part (34) and said signal output part (35), respectively; and the sources of said field effect transistors (16) and (28) forming said variable resistors (53) and (54) are connected to a base potential part (GND) via capacitors (18) and (30), respectively, and via said ground line (57).

16. A cellular mobile telephone terminal according to claim 14, wherein said field effect transistor (21) forming said variable resistor (51) is chosen to have a threshold voltage higher than the threshold voltage of said field effect transistor (25) forming said variable resistor (52).

17. A cellular mobile telephone terminal according to claim 14, wherein said field effect transistor (21) forming said variable resistor (51) is chosen to have a threshold voltage higher than the threshold voltage of said field effect transistor (25) forming said variable resistor (52) by a value corresponding to a gain control voltage range where said variable resistor (52) performs a linear gain control operation.

18. A cellular mobile telephone terminal according to claim 14, wherein the values of voltages applied to said reference voltage application parts (31) and (33) are set so that a gain control voltage range where said variable resistors (53) and (54) perform a linear gain control operation becomes continuous with a gain control voltage range where said variable resistors (51) and (52) perform a linear gain control operation.

19. A cellular mobile telephone terminal according to claim 14, wherein said variable resistors (51), (52), (53), and (54) are formed at least from field effect transistors (21), (25), (16), and (28) whose gates are connected to resistors (22), (26), (20), and (32), respectively, and wherein: the gates of said field effect transistors (21) and (25) forming said variable resistors (51) and (52) are connected to said gain control voltage application part (42) via said resistors (22) and (26), respectively, and via said gain control line (56); the gates of said field effect transistors (16) and (28) forming said variable resistors (53) and (54) are connected together via said resistors (20) and (32); a resistor (41) is inserted between the sources of said field effect transistors (21) and (25) forming said variable resistors (51) and (52); a resistor (39) is inserted between the source of said field effect transistor (25) forming said variable resistor (52) and a part (61) connected via said resistors (20) and (32) to the gates of said field effect transistors (16) and (28) forming said variable resistors (53) and (54); a resistor (40) is inserted between a base potential part (GND) and said part (61) connected via said resistors (20) and (32) to the gates of said field effect transistors (16) and (28) forming said variable resistors (53) and (54); said reference voltage application part (23) is connected to the source of said field effect transistor (25) forming said variable resistor (52); said variable resistors (51) and (52) are connected in series via a capacitor (24); the sources of said field effect transistors (16) and (28) forming said variable resistors (53) and (54) are connected to said gain control voltage application part (19) via said gain control line (56); the drains of said field effect transistors (16) and (28) forming said variable resistors (53) and (54) are connected via capacitors (17) and (29) to said signal input part (34) and said signal output part (35), respectively; and the sources of said field effect transistors (16) and (28) forming said variable resistors (53) and (54) are connected to said base potential part (GND) via capacitors (18) and (30), respectively, and via said ground line (57).

* * * * *